(12) United States Patent
Cox

(10) Patent No.: US 9,203,214 B2
(45) Date of Patent: Dec. 1, 2015

(54) LASER SYSTEM

(71) Applicant: Laser Quantum Inc., San Jose, CA (US)

(72) Inventor: Alan Cox, Wilmslow (GB)

(73) Assignee: Laser Quantum Inc., San Jose, CA (US)

( * ) Notice: Subject to any disclaimer, the term of this patent is extended or adjusted under 35 U.S.C. 154(b) by 0 days.

(21) Appl. No.: 14/107,269

(22) Filed: Dec. 16, 2013

(65) Prior Publication Data

US 2014/0247847 A1     Sep. 4, 2014

(30) Foreign Application Priority Data

Dec. 18, 2012   (GB) .................................. 1222843.3

(51) Int. Cl.
| | | |
|---|---|---|
| *H01S 3/13* | (2006.01) | |
| *H01S 5/068* | (2006.01) | |
| *H01S 5/0683* | (2006.01) | |
| *H01S 3/131* | (2006.01) | |
| *H01S 3/0941* | (2006.01) | |
| *H01S 5/042* | (2006.01) | |

(52) U.S. Cl.
CPC ........... *H01S 5/06817* (2013.01); *H01S 5/0683* (2013.01); *H01S 3/09415* (2013.01); *H01S 3/1312* (2013.01); *H01S 5/042* (2013.01)

(58) Field of Classification Search
CPC ..... H01S 3/1305; H01S 3/091; H01S 3/0933; H01S 3/094; H01S 3/102; H01S 3/1022; H01S 3/131; H01S 3/1312
See application file for complete search history.

(56) References Cited

U.S. PATENT DOCUMENTS

| | | | |
|---|---|---|---|
| 5,111,468 A * | 5/1992 | Kozlovsky et al. | ............. 372/32 |
| 5,177,755 A * | 1/1993 | Johnson | ..................... 372/38.01 |
| 6,151,343 A | 11/2000 | Jurgensen | |
| 2006/0215716 A1* | 9/2006 | Luo et al. | ................... 372/38.08 |

FOREIGN PATENT DOCUMENTS

EP        0850501        7/1998

OTHER PUBLICATIONS

Search Report of the Intellectual Property Office in Application No. GB1222843.3, Mar. 22, 2013, 3 pages.

* cited by examiner

*Primary Examiner* — Jessica Stultz
*Assistant Examiner* — Sean Hagan
(74) *Attorney, Agent, or Firm* — Faegre Baker Daniels LLP

(57) ABSTRACT

A laser system comprising a laser configured to generate a laser beam, a power supply arranged to provide a drive power to the laser, a photodetector arranged to detect the power of the laser beam and provide a detection signal from the power of the laser beam and a feedback loop arranged to form a feedback signal by subtracting a target signal from the detection signal wherein the feedback signal has a high bandwidth, amplify the feedback signal and adjust the drive power according to the amplified feedback signal, thereby reducing noise in the laser beam.

43 Claims, 12 Drawing Sheets

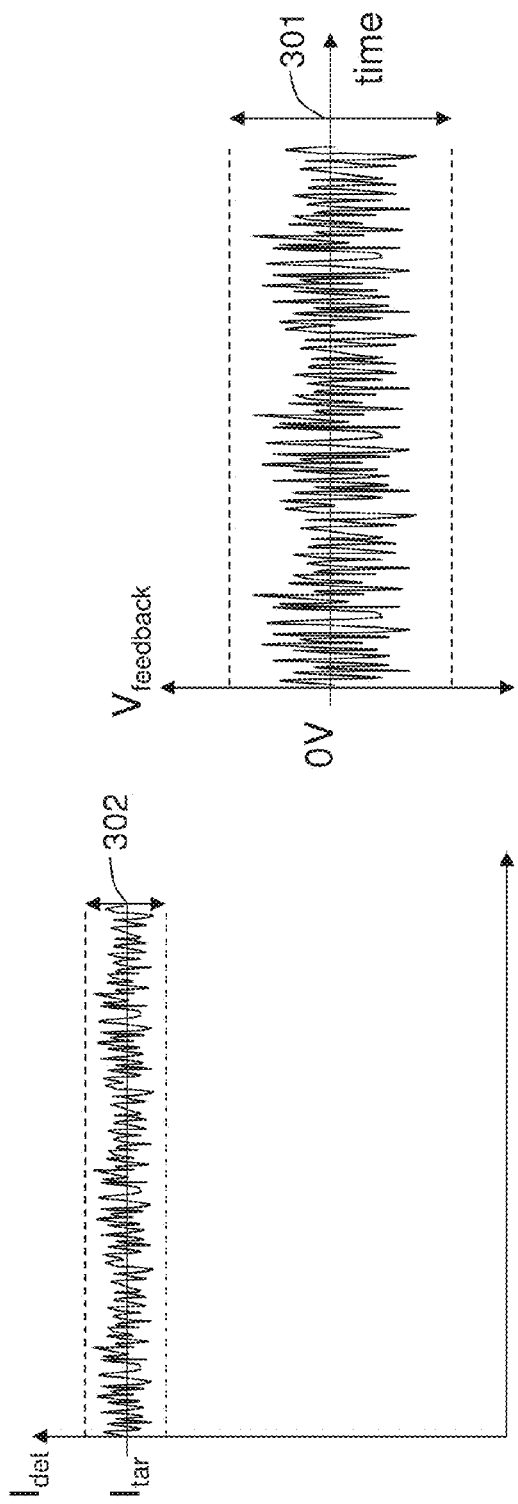

LASER SYSTEM

The present application claims priority to British Application No. 1222843.3, filed Dec. 18, 2012, titled Laser System, the entire disclosure of which is expressly incorporated by reference.

The present invention relates to a laser system.

When a laser emits a laser beam, the power of the laser beam may fluctuate. Fluctuations in the power of the laser beam are generally referred to as laser 'noise'. This noise in the laser beam may be detrimental in application areas in which stability of laser beam power is required. Although there are known ways of reducing the noise in a laser beam, these known ways suffer from disadvantages.

It is an object of the present invention to provide a laser system which reduces laser beam noise in a manner which is novel and inventive over the prior art.

SUMMARY OF THE INVENTION

According to a first aspect of the invention there is provided a laser system comprising, a laser configured to generate a laser beam, a power supply arranged to provide a drive power to the laser, a photodetector arranged to detect the power of the laser beam and provide a detection signal from the power of the laser beam, and a feedback loop arranged to form a feedback signal by subtracting a target signal from the detection signal, amplify the feedback signal and adjust the drive power according to the amplified feedback signal, thereby reducing noise in the laser beam.

The feedback signal may have a high bandwidth.

The target signal may have a lower bandwidth than the feedback signal.

The feedback signal may have a bandwidth greater than 10 times the bandwidth of the target signal. The feedback signal may have a bandwidth greater than 100 times, greater than 1000 times, greater than 10,000 times, greater than 100,000 times, or greater than 1,000,000 times the bandwidth of the target signal. In some cases the feedback signal may have a bandwidth of greater than 10,000,000 or even 100,000,000 times the bandwidth of the target signal. The target signal may be a substantially constant signal (or DC level) with little or no variation.

The target signal may have a low bandwidth. The bandwidth of the target signal may be less than 1 Hz, less than 0.1 Hz or less than 0.01 Hz.

The feedback signal may have a bandwidth which is equal to or greater than 10 kHz.

The feedback signal may have a bandwidth which is equal to or greater than 100 kHz.

The laser system may further comprise a low-pass filter configured to low-pass filter the target signal before the subtraction of the target signal from the detection signal. This could significantly reduce the effect of electrical noise or RF pickup for example.

The target signal may be such that it removes substantially all of the DC component of the detection signal, leaving a reduced DC signal level to be amplified and become the feedback signal. Alternatively, the target signal may remove 90%, 99% or even 99.9% of the DC component of the detection signal.

The target signal may have an amplitude of greater than two times the amplitude of the feedback signal. The target signal may have an amplitude of greater than 10 times, greater than 100 times, greater than 1000 times or greater than 10,000 times the amplitude of the feedback signal.

The drive power may comprise a first power having a low bandwidth from which a second power having a high bandwidth is subtracted.

The drive power may comprise a first power having a low bandwidth summed with a second power having a high bandwidth.

Adjusting the drive power according to the amplified feedback signal may comprise adjusting the second power according to the amplified feedback signal.

The laser system may further comprise a controller arranged to control the first power and/or the target signal such that an average over time of the feedback signal is substantially equal to zero or a predetermined constant.

The feedback loop may further comprise a variable gain amplifier.

The controller may be further arranged to control the gain of the variable gain amplifier such that it reduces (e.g. minimises) noise in the laser beam over a predetermined bandwidth.

The feedback loop may further comprise one or more phase lead compensator circuits, wherein the one or more phase lead compensator circuits are configured to advance the phase of the amplified feedback signal.

The controller may be further arranged to adjust the phase lead compensation of the one or more phase lead compensator circuits such that it reduces (e.g. minimises) noise in the laser beam over a predetermined bandwidth.

The laser system may further comprise an input configured to receive an error signal and add the error signal to the feedback signal.

The input may be further configured to add a first portion of the error signal to the feedback signal before amplification and add a second portion of the error signal to the feedback signal after amplification. The first and second portions may be chosen such that the effect on the output power of the laser due to a change in error signal is approximately the same regardless of the chosen loop gain.

The laser may comprise a pump configured to transfer power to a gain medium, the gain medium being configured to generate a laser beam.

The pump may comprise a laser diode system. The laser diode system comprising, a laser diode configured to generate a laser diode beam, a second photodetector arranged to detect the power of the laser diode beam and form a laser diode detection signal from the power of the laser diode beam and a laser diode feedback loop arranged to form a high bandwidth laser diode feedback signal by subtracting a low bandwidth laser diode target signal from the laser diode detection signal, amplify the high bandwidth laser diode feedback signal and adjust, according to the amplified high bandwidth laser diode feedback signal, the drive power, thereby reducing fluctuations of the power of the laser diode beam.

A portion of the feedback signal may be added to the high bandwidth laser diode feedback signal.

A first portion of the feedback signal may be added to the high bandwidth laser diode feedback signal before amplification and a second portion of the feedback signal may be added to the high bandwidth laser diode feedback signal after amplification.

The power supply may be positioned within a control box, and the laser, the photodetector and the feedback loop may be positioned within a laser head.

According to a second aspect of the invention there is provided a method of reducing noise in a laser beam generated by a laser, the method comprising, detecting the power of the laser beam to form a detection signal, forming a feedback signal by subtracting a target signal from the detection signal, amplifying the feedback signal and adjusting, according to the amplified feedback signal, a drive power which drives the laser, thereby reducing noise in the laser beam.

The feedback signal may have a high bandwidth.

The target signal may have a lower bandwidth than the feedback signal.

The feedback signal may have a bandwidth greater than 10 times the bandwidth of the target signal. The feedback signal may have a bandwidth greater than 100 times, greater than 1000 times, greater than 10,000 times, greater than 100,000 times, or greater than 1,000,000 times the bandwidth of the target signal. In some cases the feedback signal may have a bandwidth of greater than 10,000,000 or even 100,000,000 times the bandwidth of the target signal. The target signal may be a substantially constant signal (or DC level) with little or no variation.

The target signal may have a low bandwidth. The bandwidth of the target signal may be less than 1 Hz, less than 0.1 Hz or less than 0.01 Hz.

The feedback signal may have a bandwidth which is equal to or greater than 10 kHz.

The feedback signal may have a bandwidth which is equal to or greater than 100 kHz.

Forming the feedback signal by subtracting the target signal from the detection signal, may further comprise low-pass filtering the target signal before the subtraction of the target signal from the detection signal.

The target signal may be such that it removes substantially all of the DC component of the detection signal, leaving a reduced DC signal level to be amplified and become the feedback signal. Alternatively, the target signal may remove 90%, 99% or even 99.9% of the DC component of the detection signal.

The target signal may have an amplitude of greater than two times the amplitude of the feedback signal. The target signal may have an amplitude of greater than 10 times, greater than 100 times, greater than 1000 times or greater than 10,000 times the amplitude of the feedback signal.

The drive power may comprise a first power having a low bandwidth from which a second power having a high bandwidth is subtracted.

The drive power may comprise a first power having a low bandwidth summed with a second power having a high bandwidth.

Adjusting the drive power according to the amplified feedback signal may comprise adjusting the second power, according to the amplified feedback signal.

The method may further comprise controlling the first power and/or the target signal such that an average over time of the feedback signal is substantially equal to zero or a predetermined constant.

The method may further comprise adding an error signal to the feedback signal.

A first portion of the error signal may be added to the feedback signal before amplification and a second portion of the error signal may be added to the feedback signal after amplification.

BRIEF DESCRIPTION OF THE DRAWINGS

Specific embodiments of the invention will now be described by way of example only, with reference to the accompanying Figures in which:

FIG. 3b is a graph showing an example detection current as a function of time;

FIG. 3c is a graph of the output voltage of a transimpedance amplifier as a function of time when the input of the transimpedance amplifier is equal to the detection current of FIG. 3b minus a target current;

DETAILED DESCRIPTION OF THE INVENTION

Figure 1:
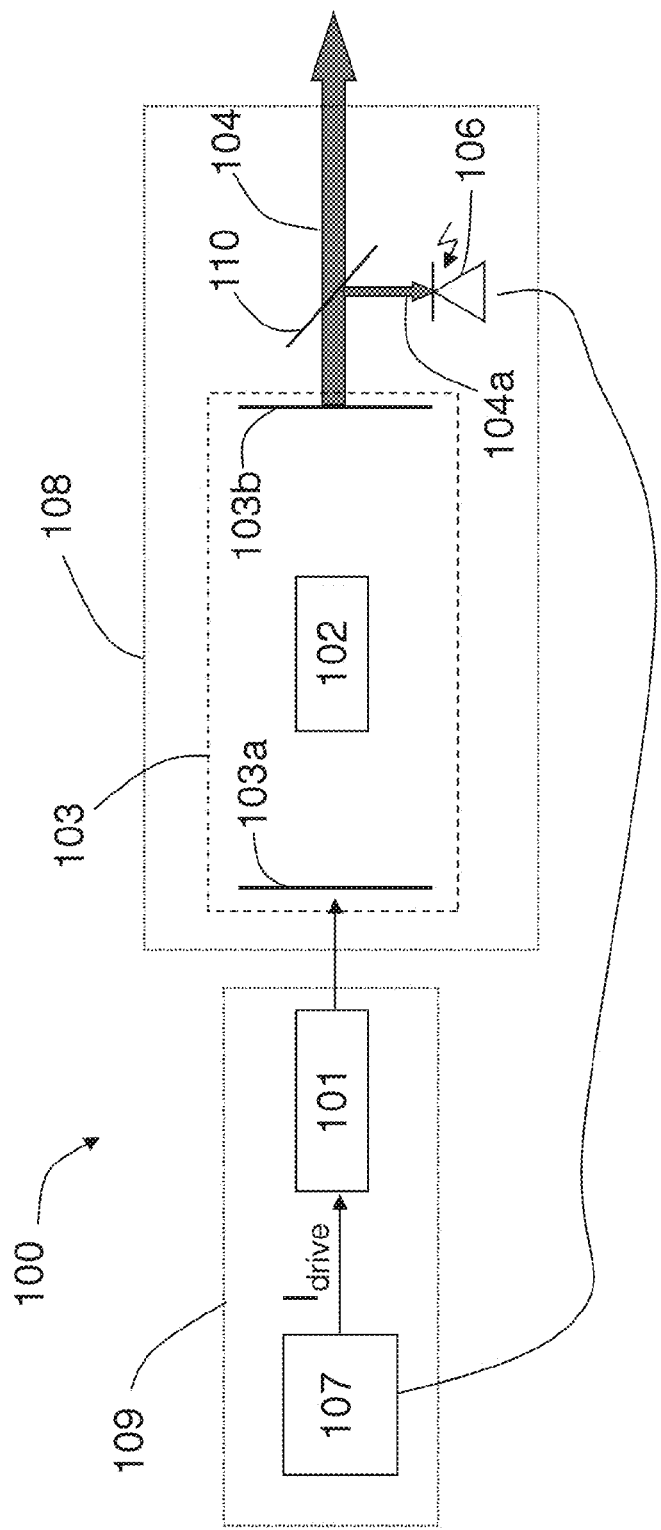
FIG. 1 is a schematic illustration of a laser system according to an embodiment of the invention.

FIG. 1 schematically depicts a laser system 100 comprising a pump 101 and a gain medium 102 inside an optical cavity 103 which is defined by a pair of mirrors 103a,b. The pump 101 may for example be an optical pump 101 which supplies pump radiation which excites the gain medium 102. Mirror 103a is substantially transparent to pump radiation, and thus allows the pump radiation to pass from the optical pump to the gain medium 102. The gain medium 102 is a material which emits photons when supplied with pump energy, some of the photons being emitted as a result of stimulated emission. The mirrors 103a,b reflect photons emitted by the gain medium 102 such that they pass back through the gain medium and thereby stimulate the emission of additional photons. This causes oscillation of the laser, i.e. the generation of a laser beam. One of the mirrors 103b is partially transparent to the radiation emitted by the gain medium 102. This mirror 103b acts as an output coupler which couples part of the laser beam out of the optical cavity 103, thereby providing an output laser beam 104.

The gain medium 102 may be any material which when pumped by the pump 101, amplifies radiation through the process of stimulated emission. The gain medium 102 may for example be a gas, liquid, plasma or may be a solid state gain medium such as a crystal, a semiconductor or an optical fibre (such as a glass fibre). A solid state gain medium may comprise a host material doped with an active ion. The host material may be YVO4, YAG, YGW, KGW, GdVO4, YLF, glass or any other suitable material. The active ion may be Yb, Nd, Er, Cr or any other suitable dopant. The solid state gain medium may comprise Nd:YVO4, Nd:YAG, Nd:YLF, Nd, GdVO4, Yb:YAG, Yb:glass, or any other suitable material.

The power of the laser beam 104 is determined in part by the power supplied to the gain medium 102 by the pump 101. The pump 101 may be an optical pump such as a flash lamp, arc lamp or another laser such as a laser diode. The pump 101 may alternatively pump the gain medium 102 by electrical pumping. The pump 101 is powered by a power supply 107 which provides the pump 101 with a drive current $I_{drive}$. In an alternative embodiment, the power supply 107 may provide the pump 101 with a drive voltage. The power supplied to the pump 101 may be controlled, thereby controlling the power supplied to the gain medium 102. This in turn controls the power of the laser beam 104.

The laser system 100 may comprise a laser head and a control box. The laser head is a housing from which the laser beam 104 is emitted, and is represented schematically in FIG. 1 by a box 108. The gain medium 102 and optical cavity formed by the mirrors 103*a,b* may be located in the laser head 108. The pump 101 may also be located in the laser head 108. Alternatively, the pump 101 may be positioned in the control box (e.g. as shown), which is represented schematically in FIG. 1 by a box 109. Where this is the case, pump energy may be transferred to the laser head 108 via an optical or electrical cable (not shown).

The power supply 107 which supplies the drive current $I_{drive}$ to the pump 101 may be located in the control box 109, which may be located away from the laser head 108. The power supply 107 may require cooling by a cooling system which may comprise one or more cooling fans. The one or more cooling fans may cause substantial mechanical vibration. Positioning the power supply and the one or more cooling fans in the control box 109 away from the laser head 108 will reduce the impact of mechanical vibrations on the components positioned in the laser head (these may include optical components which are sensitive to mechanical vibration).

During operation of the laser system 100, a power signal carried by the drive current $I_{drive}$ is transferred from the power supply 107 to the pump 101. The power signal then is transferred from the pump 101 to the gain medium 102 in the optical cavity, where the laser beam 104 is generated. Noise may be introduced during the transfer of the power signal between the components of the laser, and this may result in the power of the laser beam 104 having a substantial noise component. Mechanisms via which noise may be introduced into the laser beam 104 include for example, relaxation oscillations in the gain medium 102, mechanical vibration of the laser 100. If an intra-cavity frequency conversion system is used then an instability which is often referred to as Green Noise may introduce noise into the laser beam. Laser beam 104 may be used in applications such as high energy physics, holography, optical communications, DNA sequencing, or to pump another laser (e.g. a titanium sapphire laser). For such applications it is often desirable that noise in the laser beam 104 is substantially reduced.

The noise in the laser beam 104 is reduced through monitoring the power of laser beam 104 by exposing a photodiode 106 (or other photodetector) to a portion 104*a* of the laser beam 104. The portion of the laser beam 104*a* may for example be separated from the full laser beam 104 using a glass plate 110 and directed onto the photodiode 106. The photodiode 106 generates a detection signal in the form of a current or voltage which corresponds to the power of the laser beam 104 incident on the photodiode. The detection signal is used to adjust the power of the laser beam 104 in order to reduce the noise in the laser beam 104.

In one approach known from the prior art, the power of the laser beam 104 may be adjusted by placing an optical modulator, such as an acousto-optic modulator or electro-optic modulator, in the path of the laser beam 104. The detection signal from the photodiode 106 may be passed to the optical modulator, the optical modulator being controlled by the detection signal to attenuate the laser beam 104 according to the detection signal such that the noise in the laser beam is reduced.

An embodiment of the invention is illustrated in FIG. 1 which uses an alternative approach. The power of the laser beam 104 is adjusted by feeding back the detection signal from the photodiode 106 in order to adjust the power supplied by the power supply 107 to the pump 101.

The noise component (i.e. fluctuation) of the power of the laser beam 104 may comprise a small portion of the total power of the laser beam 104. For example a diode pumped solid state laser may produce a laser beam which has a noise component with a power which is approximately $1/100^{th}$ or even $1/1000^{th}$ of the total power of the laser beam 104. The noise component of the laser beam 104 therefore corresponds to a small perturbation on a large DC level. Given the relatively small amplitude of the perturbation, the detection signal must first be amplified before it can be used to adjust the power supplied to the pump 101. The detection signal may be amplified close to the photodiode 106 (e.g. inside the laser head 108) in order to reduce the extent to which electrical and/or radio frequency noise is introduced into the detection signal before amplification.

The detection signal is amplified such that the amplified noise component of the detection signal has an amplitude which is large enough to be usefully used to adjust the current or power supplied to the pump 101. By way of example a 0.001 mA change of the detection signal (which may for example have a constant DC level of ~1 mA) may be used to effect a change in the drive current to the pump of perhaps 10 mA, giving an overall current gain of 10,000. This overall current gain could be >100, >1,000, >10,000 or even >100,000. The amplified noise component may for example be sufficiently large that it dominates over background electrical pickup. Since the detection signal includes a relatively large DC component, amplification of the whole detection signal to a useful level could result in an amplified signal which, if transferred as a voltage, would have a magnitude in the range of hundreds of volts to a few kilovolts. A signal having a magnitude of a few kilovolts is difficult to generate, expensive and dangerous. In order to avoid large amplified signals, the DC component may be removed from the detection signal before the detection signal undergoes substantial amplification.

One way which is suggested in the prior art for removing the DC component from a detection signal is by using AC coupling. AC coupling only transmits components of the detection signal having a frequency greater than an AC coupling frequency. The AC coupling frequency may, for example, be approximately a few tens of Hertz. Since only components of the detection signal having high frequencies (i.e. greater than the AC coupling frequency) are transmitted, the DC component of the signal is removed. AC coupling thus allows for amplification of the AC coupled signal to a magnitude suitable to be fed back to adjust the power supplied from the power supply 107 to the pump 101 in order to reduce the noise in the laser beam 104. Thus, an AC coupled feedback loop is established which acts on modulations of the detection signal, the AC coupled feedback loop acting to hold the laser beam 104 at a substantially constant power.

For some applications of the laser, it is desirable that the power of the laser beam 104 is not constant but instead modulates according to a predetermined signal. In such applications it is still desirable to substantially remove noise from the laser beam 104. An AC coupled feedback loop such as the one described above may be used to modulate the power of the laser beam 104 by adding an external modulation signal into the feedback loop between the photodiode 106 and the power supply 107. The AC coupled feedback loop will then act to correct for the external modulation signal and cause a modulation in the power of laser beam 104. However, since the feedback loop is AC coupled, it will not react to any modulation signal having a frequency less than the AC coupling frequency. It is therefore not possible to hold the power of the laser beam 104 above or below its average power for a period of time much greater than an AC coupling time constant, where the AC coupling time constant is inversely proportional to the AC coupling frequency.

AC coupling of the detection signal in the AC coupled feedback loop also means that the AC coupled feedback loop does not react to any noise components of the laser beam 104 having a frequency less than the AC coupling frequency. For example if the power of laser beam 104 undergoes a step change (for example, due to an unwanted change of the laser beam mode), then the AC coupled feedback loop will smooth the higher frequency components of the step change (and thus round off the edges of the step) but the step change itself will still occur.

For some applications of the laser system 100 it may be desirable to have a noise reducing feedback loop which is able to act on modulations having frequencies across a wide bandwidth. For example it may be desirable that a noise reducing feedback loop suitable for use with a diode pumped solid state laser acts on modulations having frequencies across a bandwidth of several MHz. It may therefore be desirable to have a noise reducing feedback loop which retains the low frequency, large magnitude DC component of the detection signal but only amplifies the high frequency, low magnitude AC coupled component of the detection signal.

Figure 2:
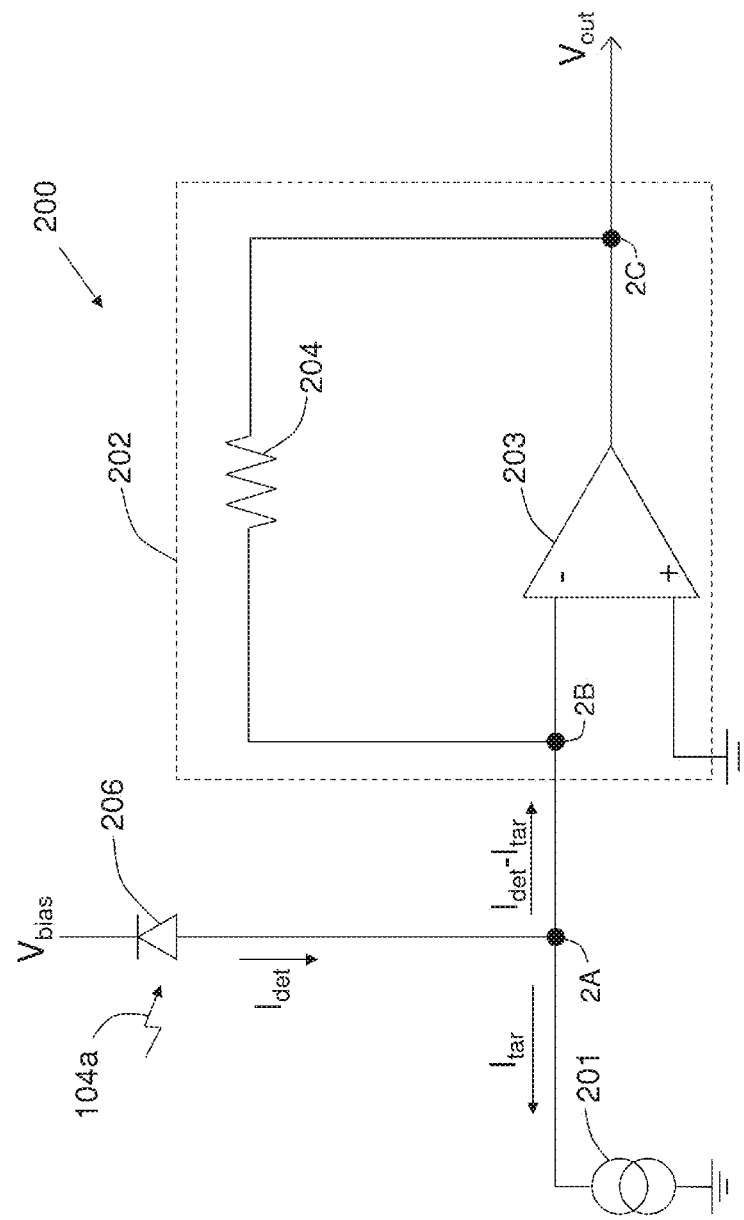
FIG. 2 is a schematic illustration of a circuit suitable for subtracting a target current from a detection signal, which may form part of an embodiment of the invention.

In an embodiment of the invention, the detection signal is split into two components by subtracting a target current (which may be a DC or slowly varying value) from the detection signal. FIG. 2 depicts a circuit 200 suitable for subtracting a target current $I_{tar}$ from a detection current $I_{det}$ according to an embodiment of the invention. A reverse biased photodiode 206 is positioned in the path of a portion of the laser beam 104a. Radiation from the laser beam 104a induces a current $I_{det}$ to flow from the photodiode 206 to node 2A. Current $I_{det}$ is a detection signal and is a measure of the power of the laser beam 104a. A current sink 201 causes a target current $I_{tar}$ to flow from node 2A to the current sink 201. Due to the conservation of current at node 2A a current $I_{det}-I_{tar}$ flows from node 2A to node 2B. A transimpedance amplifier 202 comprises an operational amplifier 203 connected in parallel with a resistor 204. The operational amplifier 203 has a high input impedance and therefore the current $I_{det}-I_{tar}$ does not flow in to the operational amplifier 203 but instead flows through the resistor 204. The positive terminal of the operational amplifier 203 is connected to earth and thus node 2B is a virtual earth. The operational amplifier 203 adjusts its output voltage $V_{out}$ at node 2C in order to keep the voltage at node 2B equal to 0V. The voltage $V_{out}$ is equal to $-(I_{det}-I_{tar})$ multiplied by the resistance of the resistor 204. The voltage $V_{out}$ is therefore a feedback signal which corresponds to the difference between the detection signal $I_{det}$ and the target current $I_{tar}$.

Target current $I_{tar}$ may be set as a DC signal which corresponds to the target power of the laser beam 104. Current sink 201 therefore serves to subtract much of the DC level from the detection signal $I_{det}$, and the signal input to the transimpedance amplifier 202 corresponds only to the difference between the power of the laser beam 104 and the target power of the laser beam 104. The target current $I_{tar}$ may be low-pass filtered before being subtracted from the detection current $I_{det}$. Low-pass filtering of the target current $I_{tar}$ removes any high frequency components of the target current $I_{tar}$, which could for example include components introduced by electrical noise and/or radio frequency pickup. Low-pass filtering of the target current $I_{tar}$ therefore produces a target current $I_{tar}$ having a low bandwidth before it is subtracted from the detection current $I_{det}$. If the target current $I_{tar}$ has a low bandwidth before it is subtracted from the detection current $I_{det}$ then any high frequency components of the voltage $V_{out}$ are a result only of the high frequency components of the detection signal $I_{det}$, and therefore typically relate to the noise in the laser beam 104.

The value of the target current $I_{tar}$ may be sent to the circuit 200 as a digital signal and converted to an analogue signal by a digital to analogue converter. Sending the value of the target current $I_{tar}$ to the circuit 200 as a digital signal (as opposed to an analogue signal) may prevent the introduction of high frequency electrical noise and/or radio frequency pickup to the signal. In this case the bandwidth of the analogue signal may depend on the update rate of the digital to analogue converter. The digital to analogue converter may convert the digital signal to the analogue signal, close to the circuit 200 in order to reduce the distance over which the analogue signal is transmitted and therefore reduce the chance of introducing high frequency electrical noise and/or radio frequency pickup to the analogue signal.

If the power of the laser beam 104 is not substantially different to the target power then voltage $V_{out}$ may be a relatively small voltage with high frequency components which correspond to the noise in the laser beam 104. The voltage $V_{out}$ may also include low frequency components which correspond to a difference in the DC levels of the detection current $I_{det}$ and the target current $I_{tar}$. The feedback signal $V_{out}$ is amplified and fed back to the power supply 107, thereby adjusting the power supplied to the pump 101.

The transimpedance amplifier 202 has a limited compliance voltage and will clip any signal which is sufficiently large that it causes the transimpedance amplifier to reach this compliance voltage. The transimpedance amplifier 202 therefore has a window of operation within which a signal may be passed to the output voltage $V_{out}$ without being clipped. The centre of this window of operation is determined by the target current $I_{tar}$ and the upper and lower limits of the window are determined by the compliance voltage of the transimpedance amplifier 202.

Figure 3A:
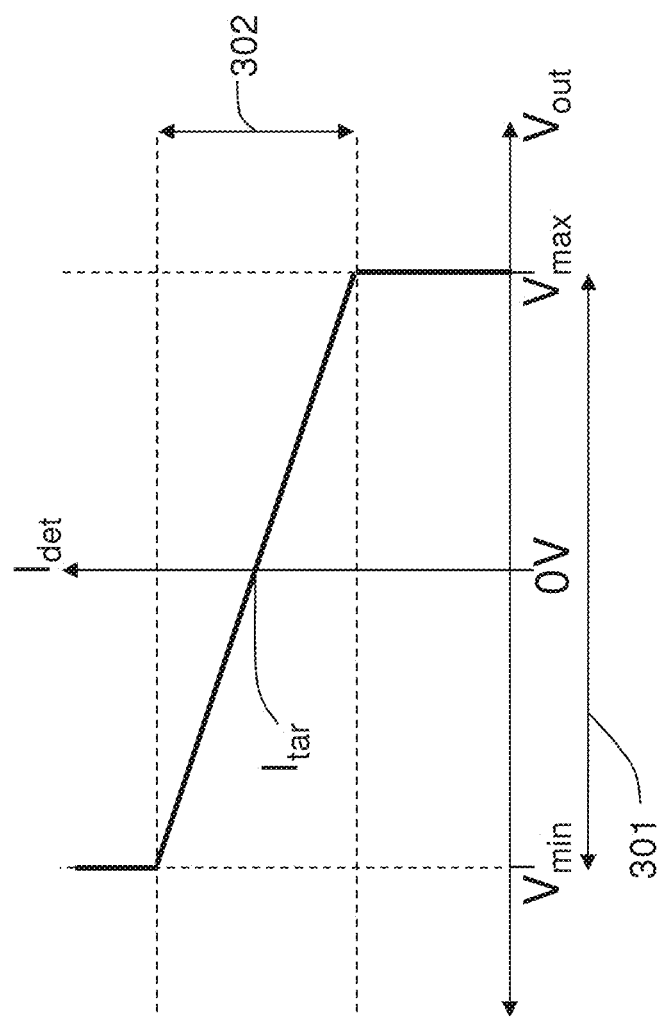
FIG. 3a is a graph which shows the output voltage of a transimpedance amplifier as a function of an input detection current.

FIG. 3a is a graph which shows the output voltage $V_{out}$ (x-axis) of the transimpedance amplifier 202 as a function of the detection current $I_{det}$ (y-axis). The output voltage $V_{out}$ forms a feedback signal which may be fed back to adjust the power supplied to the pump 101. The compliance voltage 301 of the transimpedance amplifier defines a window 302 within which $V_{out}$ responds to changes in $I_{det}$. Window 302 is centred on the target current $I_{tar}$. If the detection current $I_{det}$ falls below a lower limit of the window 302 then the output voltage $V_{out}$ of the transimpedance amplifier is equal to the maximum voltage of the transimpedance amplifier $V_{max}$. If the detection current $I_{det}$ rises above an upper limit of the window 302 then the output voltage $V_{out}$ of the transimpedance amplifier is equal to the minimum voltage of the transimpedance amplifier $V_{min}$. Any changes of the detection current $I_{det}$ which fall outside of the window 302 therefore lead to clipping of the output voltage $V_{out}$ and of the feedback signal which may be fed back to adjust the power supplied to the pump 101.

FIG. 3b shows a graph of an example detection current $I_{det}$ as a function of time. The detection current $I_{det}$ falls inside the window 302 centred on the target current $I_{tar}$. FIG. 3c shows a graph of the output voltage $V_{out}$ of the transimpedance amplifier 202 as a function of time when the input of the transimpedance amplifier is equal to the detection current of FIG. 3b minus the target current $I_{tar}$. This voltage may be used as a feedback signal $V_{feedback}$.

By subtracting a known target current $I_{tar}$ from the detection current $I_{det}$, the full detection signal information is retained in the target current $I_{tar}$ and the feedback signal $V_{feedback}$. The feedback signal $V_{feedback}$ is separated from the DC component comprising $I_{tar}$. In order to maintain a good signal to noise ratio (e.g. in the presence of electrical noise) the feedback signal may be amplified before being used to adjust the power supplied to the pump 101 by the power supply 107. The feedback signal may be used in combination with the target current $I_{tar}$ as a measure of the power of the laser beam 104. The feedback signal may also be used to measure the root mean square noise component of the laser beam 104 with a good signal to noise ratio.

Figure 4:
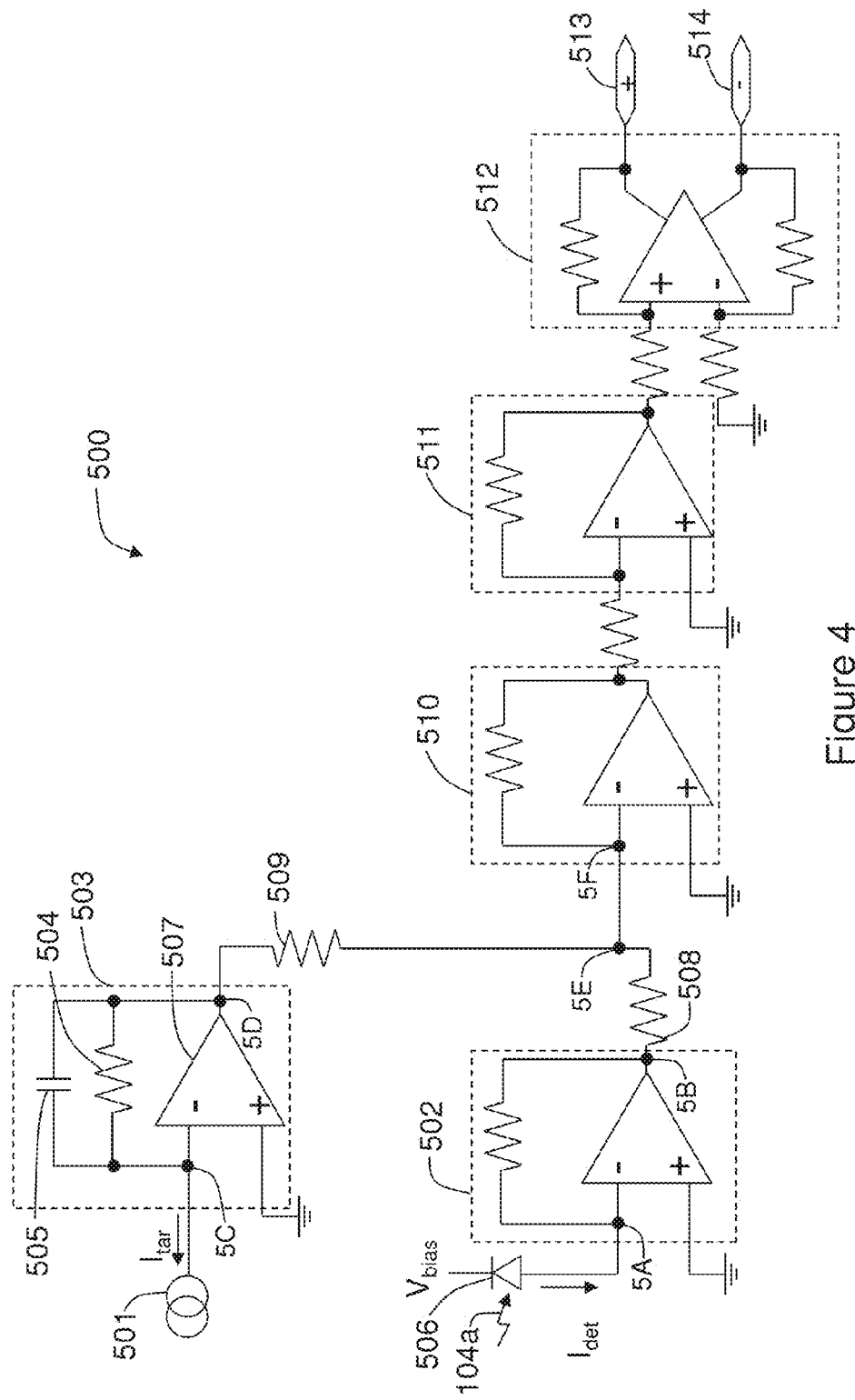
FIG. 4 is a schematic illustration of a first portion of a feedback circuit suitable for reducing noise in a laser beam, according to an embodiment of the invention.

FIG. 4 depicts a first portion 500 of a feedback circuit suitable for reducing the noise in the laser beam 104 according to an embodiment of the invention. Parts of the circuit provide similar functionality to the circuit shown in FIG. 2.

A reverse biased photodiode 506 is positioned in the path of a portion of the laser beam 104a. Radiation from laser beam 104 induces a current $I_{det}$ to flow from the photodiode 506 to node 5A. A transimpedance amplifier 502 converts current $I_{det}$ to a voltage at node 5B.

A current source 501 causes a target current $I_{tar}$ to flow between the current source 501 and node 5C. A low pass filter 503 comprising a resistor 504 and a capacitor 505 connected in parallel to an operational amplifier 507 converts the target current $I_{tar}$ to a voltage at node 5D. The low pass filter 503 serves to remove any high frequency components of the target current $I_{tar}$, and thus the voltage at node 5D is a low frequency DC signal. The low pass filter 503 may for example remove components of the target current $I_{tar}$ which have frequencies >1 Hz, >10 Hz, >50 Hz, >1 kHz, >10 kHz or >100 kHz so that any high frequency electrical noise and/or radio frequency pickup is substantially removed from the target current $I_{tar}$. In this context the term "substantially removed" may be interpreted as meaning that the high frequency electrical noise and/or radio pickup is significantly attenuated.

Voltages at nodes 5B and 5D cause currents to flow, through resistors 508 and 509, which correspond to (and vary linearly with) $I_{det}$ and the low frequency component of $I_{tar}$ respectively. Conservation of current at node 5E means that the current which flows between node 5E and node 5F is a measure of the difference between $I_{det}$ and the low frequency component of $I_{tar}$ (with appropriate relative gain factors). If $I_{tar}$ is set to correspond to the target power of the laser beam 104 then the current which flows between node 5E and node 5F forms a feedback signal corresponding to the difference between the power of laser beam 104 and the target power of laser beam 104.

The feedback signal, once obtained, is amplified. Because the majority of the DC component of the signal has been removed before amplification, large amplified DC voltages are avoided. The feedback signal is passed through transimpedance amplifiers 510 and 511 which serve to amplify the feedback signal to a level suitable to be fed back (whilst maintaining a good signal to noise ratio) in order to adjust the power supplied to the pump 101. After amplification the feedback signal is passed to a differential line driver 512. Differential line driver 512 converts the feedback signal to a difference between the voltage at a positive output 513 and a negative output 514. Converting the feedback signal to a differential line signal allows the feedback signal to be sent along wires connected to outputs 513 and 514 as a robust signal which is less likely to suffer from electromagnetic interference than if the feedback signal were to be sent along a single wire. This is particularly advantageous if the circuit 500 is inside the laser head 108 (see FIG. 1) and is then passed through a cable to a control box 109. The control box may be separated from the laser head by a substantial distance. For example the laser head may be separated from the control box by a distance of >0.5 m, >1 m or >2 m thus increasing the likelihood of the feedback signal suffering from electromagnetic interference.

Figure 5:
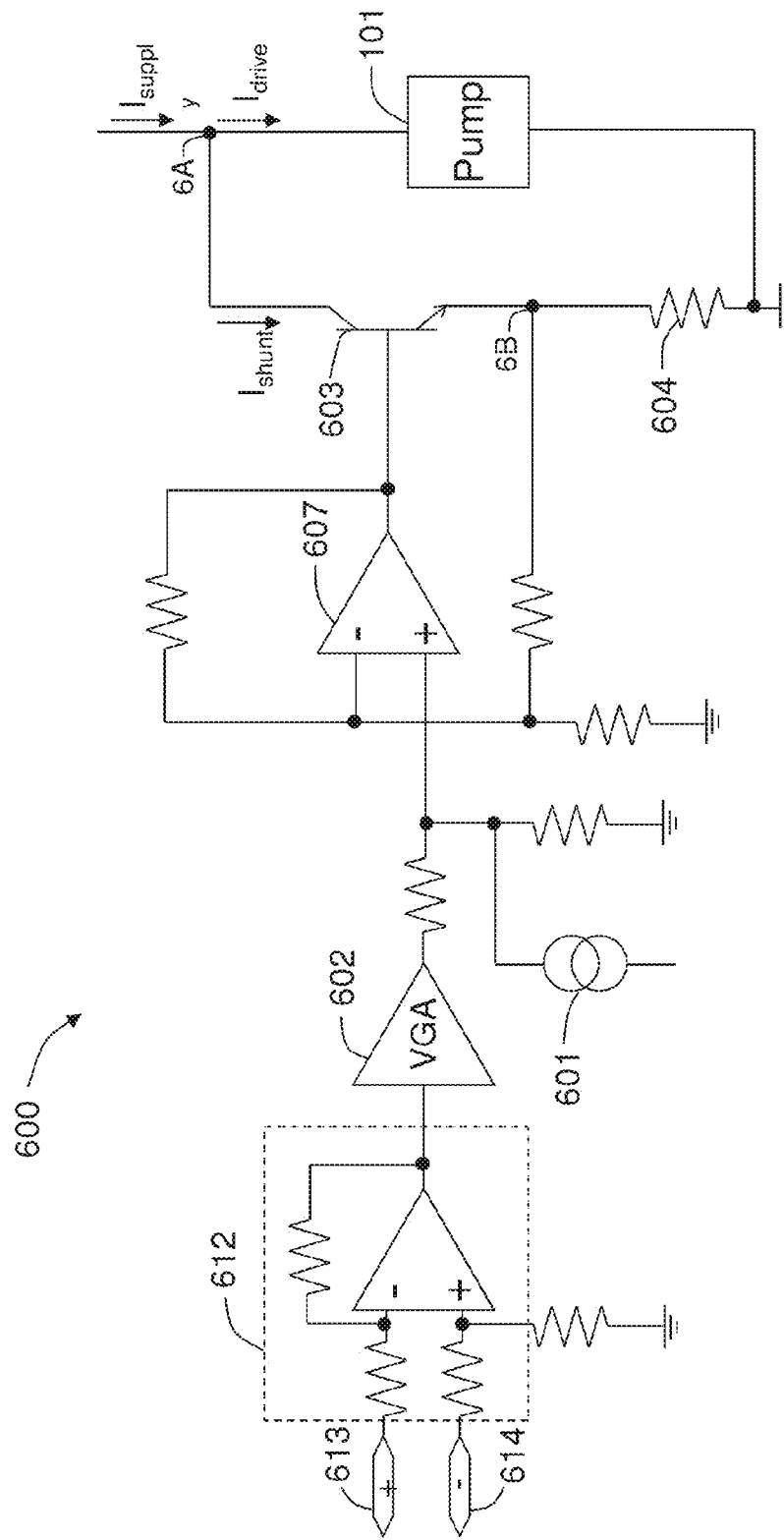
FIG. 5 is a schematic illustration of a second portion of a feedback circuit suitable for reducing noise in a laser beam according to an embodiment of the invention.

FIG. 5 depicts a second portion 600 of a feedback circuit suitable for reducing the noise in the laser beam 104 according to an embodiment of the invention. The circuit 600 may for example be inside the control box 109 (see FIG. 1). Negative and positive inputs 613 and 614 receive a differential line feedback signal such as that generated at outputs 513 and 514 in FIG. 4. A differential line receiver 612 converts the differential line signal into a single ended feedback signal which is subsequently amplified by a variable gain amplifier 602. Variable gain amplifier 602 may be an operational amplifier with a gain controlled by a voltage signal or a digital signal. The gain of the variable gain amplifier 602 may be controlled by a laser controller (not shown).

A current source 601 applies an offset to the current flowing between the variable gain amplifier 602 and the positive terminal of an operational amplifier 607. The output of operational amplifier 607 is connected to a NPN bipolar junction transistor 603. The NPN bipolar junction transistor 603 is connected in parallel to the pump 101 which is provided with a supply current $I_{supply}$. The signal which is input to the NPN bipolar junction transistor 603 determines the current $I_{shunt}$ which flows between node 6A and node 6B. Conservation of current at node 6A, means that the current $I_{drive}$ supplied to the pump 101 is therefore equal to $I_{supply}-I_{shunt}$ and the power supplied to the pump 101 is thus adjusted by the feedback signal at the NPN bipolar junction transistor 603. The embodiment depicted in FIG. 5 may therefore be considered as an example of adjusting the drive current $I_{drive}$ according to an amplified feedback signal, thereby reducing noise in the laser beam 104.

The current $I_{shunt}$ can only act to reduce the current $I_{drive}$ supplied to the pump 101. A positive offset may therefore be added to the supply current $I_{supply}$ such that $I_{supply}$ is always larger than a target value of the drive current $I_{drive}$. The offset applied to the feedback signal by the current source 601 is applied such that the current $I_{shunt}$ may then remove the positive offset added to the supply current $I_{supply}$. A resistor 604 has a resistance $R_{sense}$ such that the voltage at node 6B is a measure of the current $I_{shunt}$ which is fed back to the negative terminal of operational amplifier 607 and determines the amplification of the signal passed to the NPN bipolar junction transistor 603.

$I_{supply}$ is typically a relatively large magnitude, low bandwidth, DC current level (of the range of a few amperes to a few hundred amperes). $I_{shunt}$ is typically a small magnitude, high bandwidth, current (of the range of a few tens of milliamperes to an ampere). Since the NPN bipolar junction transistor 603 is only required to act on a small fraction of the total current supplied to the pump 101, it can easily be designed to have a large frequency bandwidth of operation and the power supplied to the pump 101 may therefore be adjusted over a large frequency bandwidth. In order to adjust the current $I_{drive}$ a small change in voltage at node 6A is required. The voltage at node 6A may not be able to change at high frequencies if too much capacitance is connected in parallel with the current $I_{supply}$. It may therefore be desirable to reduce the capacitance in parallel with the current $I_{supply}$. A series inductor having a small inductance may be connected in series with the current $I_{supply}$ in order to allow high frequency changes in the voltage at node 6A.

In an alternative embodiment, the power supplied to the pump 101 may alternatively be adjusted by directly adjusting the current supplied to the pump 101 by the power supply 107. However, since this is a relatively large magnitude current, adjusting this current may require the use of high current transistors or field-effect transistors which have limited frequency bandwidths of operation. The current may therefore only be adjusted over a limited frequency bandwidth in such an embodiment.

Adjustment of the power supplied to the pump 101 by subtraction of a current $I_{shunt}$ is additionally advantageous if the pump 101 is positioned in the laser head 108 and a power supply 107 is positioned in a control box 109. In this case the entire feedback loop comprising circuits 500 and 600 can be positioned inside the laser head 108, and no signal needs to be passed to the power supply 107 in the control box 109. Positioning an entire feedback loop within the laser head can reduce the time taken to pass signals around the feedback loop, since the distances between components of the loop is reduced. A feedback loop contained entirely within the laser head 108 therefore has a faster feedback response.

In an embodiment, instead of using a current shunt, the current $I_{drive}$ supplied to the pump 101 may be a summation of two drive currents, $I_{d1}$ and $I_{d2}$. The current $I_{d1}$ may be a large, low bandwidth, DC current level and the current $I_{d2}$ may be a small, high bandwidth, current which is determined from the feedback signal. In this embodiment the current $I_{d2}$ can only act to increase the current $I_{drive}$. A negative offset may therefore be applied to the current $I_{d1}$ such that it is always less than a target value of the drive current $I_{drive}$. A positive offset may then added to the feedback signal before forming the current $I_{d2}$ such that the positive offset acts to counteract the negative offset applied to the current $I_{d1}$.

The pump 101 may for example comprise one or more laser diodes. If the pump 101 comprises more than one laser diode it may be advantageous to only adjust the power supplied to a subset of the pump laser diodes, wherein the subset of pump laser diodes comprises one or more but less than all of the pump laser diodes. The subset of pump laser diodes may be driven by power supplies which have a faster response to changes in power than the pump laser diodes which are not part of the subset. The frequency bandwidth over which the subset of pump laser diodes are able to respond is therefore greater than the frequency bandwidth over which the pump laser diodes which are not part of the subset are able to respond. Alternatively the subset of pump laser diodes may be operated at powers which comprise only a small portion of their possible range of operating powers. The small portion of their possible range of operating powers may be chosen such that the power of the subset of pump laser diodes responds to an input current with a substantially smooth response. The power of the pump laser diodes which are not part of the subset of pump laser diodes may be controlled by a slower control loop which acts to adjust the power of the laser beam 104 in order to keep the feedback signal $I_{det}-I_{tar}$ within a window of operation.

The circuits 500 and 600 together form a feedback loop which reduces the noise in the laser beam 104 by forming a feedback signal from the difference between a detection current $I_{det}$ and a target current $I_{tar}$. The feedback signal may be a small magnitude high bandwidth signal, which is amplified and used to adjust the current supplied to the pump 101 by subtracting a current $I_{shunt}$ from the drive current $I_{drive}$ supplied from the power supply 107. The feedback signal has a window of operation within which the feedback signal is not clipped. The centre of the window of operation is determined by the target current $I_{tar}$. The limits of the window of operation are determined by the compliance voltages of the amplification stages in circuits 500 and 600. This is discussed further above in connection with FIG. 3.

The current $I_{tar}$ may be determined from a target signal sent from a laser controller (not shown). The laser controller may for example comprise a microprocessor or alternatively an analogue circuit. The laser controller may determine the current $I_{tar}$ by sending a target signal to the current source 501 as a voltage level or a current source. The laser controller may monitor the position of the feedback signal relative to its window of operation 302 (see FIG. 3a). If the feedback signal approaches the limits of the window 302 or falls outside of the window of operation, then the target current $I_{tar}$ may be adjusted in order to adjust the position of the window of operation such that the feedback signal is brought to within the limits of its window of operation.

However, the target current $I_{tar}$ may correspond to a desired power of the laser beam 104 for a particular application. In this case, adjusting $I_{tar}$ in order to keep the feedback signal within its window of operation does not allow for the laser beam 104 to be held at its target power. The feedback signal may therefore alternatively be kept within its window of operation by adjusting the drive current $I_{drive}$. In an embodiment in which the drive current $I_{drive}$ comprises a supply current $I_{supply}$ from which a shunt current $I_{shunt}$ is subtracted, the drive current $I_{drive}$ may be adjusted in order to keep the feedback signal within its window of operation, by adjusting the supply current $I_{supply}$. The drive current $I_{drive}$ may be adjusted in order to reduce noise in the laser beam 104 by adjusting the shunt current $I_{shunt}$ according to the feedback signal.

In an embodiment in which the drive current $I_{drive}$ comprises a summation of two drive currents $I_{d1}$ and $I_{d2}$, the drive current $I_{drive}$ may be adjusted in order to keep the feedback signal within its window of operation, by adjusting the large, low bandwidth current level $I_{d1}$. The drive current $I_{drive}$ may be adjusted in order to reduce noise in the laser beam 104 by adjusting the small, high bandwidth current $I_{d2}$ according to the feedback signal.

The laser controller which adjusts either the drive current $I_{drive}$ or the target current $I_{tar}$ in order to keep the feedback signal within its window of operation may operate relatively slowly. It may for example respond to changes in the feedback signal over a time period of several seconds. In an embodiment, a laser controller adjusts either $I_{tar}$ or $I_{drive}$ such that the time averaged value of $I_{det}-I_{tar}$ is equal to zero. In an alternative embodiment, a laser controller adjusts either $I_{tar}$ or $I_{drive}$ such that the time averaged value of $I_{det}-I_{tar}$ is equal to a predetermined constant. The predetermined constant may be a value which lies within the window of operation of the feedback signal (e.g. lying in the middle of the window of operation).

Figure 6:
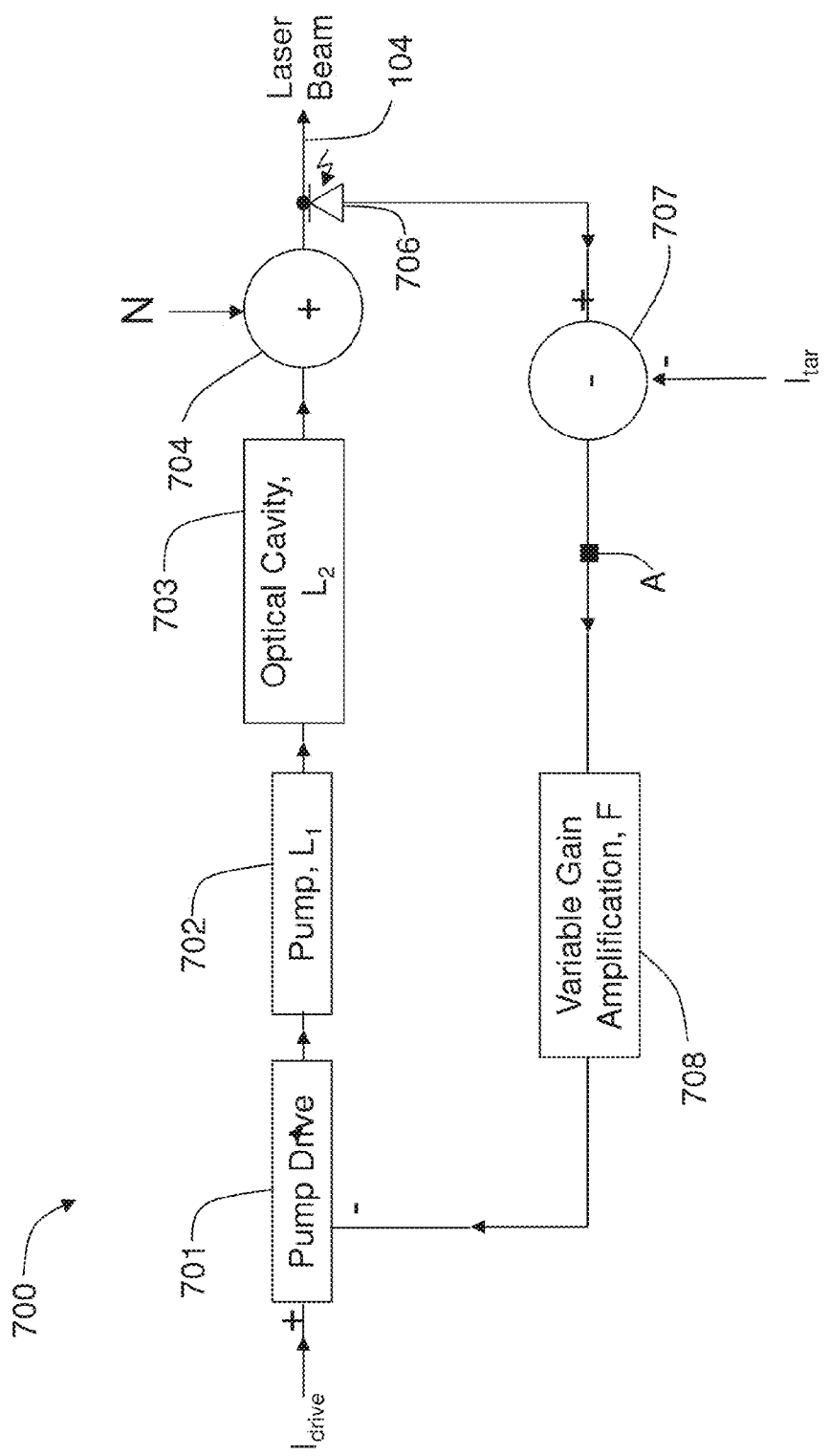
FIG. 6 is a schematic illustration of a feedback loop according to an embodiment of the invention.

FIG. 6 depicts schematically a feedback loop 700 according to an embodiment of the invention. A drive current $I_{drive}$ is input to a pump drive 701 which drives a pump 702 (e.g. a pump laser). Power is transferred by the pump 702 to an optical cavity 703 according to a transfer function $L_1$. Optical cavity 703 transfers power to a laser beam 104 according to a transfer function $L_2$. In this model a noise source, N is added at input 704. Although the noise source is shown to be added after the output of the optical cavity, noise may be introduced at multiple points in the loop, such as by the electronics of the pump drive 701, at the output of the pump 702 and at the optical cavity 703. A photodiode 706 forms a detection signal which corresponds to the power of the laser beam 104. A target current $I_{tar}$ is subtracted from the detection signal at output 707 to form a feedback signal which is amplified by a variable gain amplification stage 708. The variable gain amplification stage 708 may comprise one or more amplification stages such as those depicted in FIGS. 4 and 5. The one or more amplification stages which comprise the variable gain amplification stage 708 may include at least one variable gain amplifier which allows the gain of the variable gain amplification stage 708 to be adjusted. Variable gain amplification stage 708 amplifies the feedback signal according to an amplification function F. The amplified feedback signal is fed back to the pump drive 701 and used to adjust the power which drives the pump 702.

The drive current $I_{drive}$ and/or the target current $I_{tar}$ may be adjusted by a laser controller in order to keep the feedback signal within a window of operation defined by the target current $I_{tar}$ and the variable gain amplification stage 708. In an embodiment, the drive current $I_{drive}$ and/or the target current $I_{tar}$ is adjusted so that the time averaged feedback signal is equal to zero. In an alternative embodiment, the drive current $I_{drive}$ and/or the target current $I_{tar}$ is adjusted so that the time averaged feedback signal is equal to a predetermined constant. Functions $L_1$, $L_2$ and F are complex functions which transfer the magnitude and phase of an input to a magnitude and phase of an output as a function of frequency.

The objective of the feedback loop 700 is to reduce the level of the signal at point A, this signal being equal to the difference between the detection signal and the target signal. The signal at point A in FIG. 6 can be calculated from the signals and feedback loop parameters and given according to equation 1, $$A=((I_{drive}-AF)L_1L_2)+N-I_{tar} \tag{1}$$

Equation 1 can be rearranged to show that the signal at point A is equal to, $$A = \frac{I_{drive}L_1L_2 + N - I_{tar}}{1 + FL_1L_2} \tag{2}$$

If the gain of the variable gain amplification stage is set to 0 and hence F=0 then the signal at point A is equal to, $$A_{(F=0)}=I_{drive}L_1L_2+N-I_{tar} \tag{3}$$

When F is not equal to zero the signal at point A is therefore equal to, $$A = \frac{A_{(F=0)}}{1 + FL_1L_2} \tag{4}$$

The loop gain of the whole feedback loop is equal to $FL_1L_2$ and therefore from equation 4 it can be seen that the signal at point A reduces as a function of $$\frac{1}{1 + LoopGain},$$

where LoopGain=$FL_1L_2$ and is a complex function of frequency.

The feedback loop 700 will act to adjust the power supplied to the pump 101 in order to reduce the noise in the laser beam 104. Any deviations of the detection current $I_{det}$ from the target current $I_{tar}$ will cause a change in the power supplied to the pump 702 until the feedback signal at point A is minimised. For some applications of laser beam 104 it may desirable to adjust the power of laser beam 104 whilst simultaneously reducing the noise in the laser beam 104. This may be achieved by inputting a modulating signal (which may be referred to as an error signal $V_{err}$) into the feedback loop. Whilst only the transfer functions of the pump 702, the optical cavity 703 and the variable gain amplification stage 708 have been included here, it should be understood that the pump drive 701 and the photodiode 706 may also have complex transfer functions. The complex transfer functions acting to transfer the magnitude and phase of an input to a magnitude and phase of an output as a function of frequency.

Figure 7:
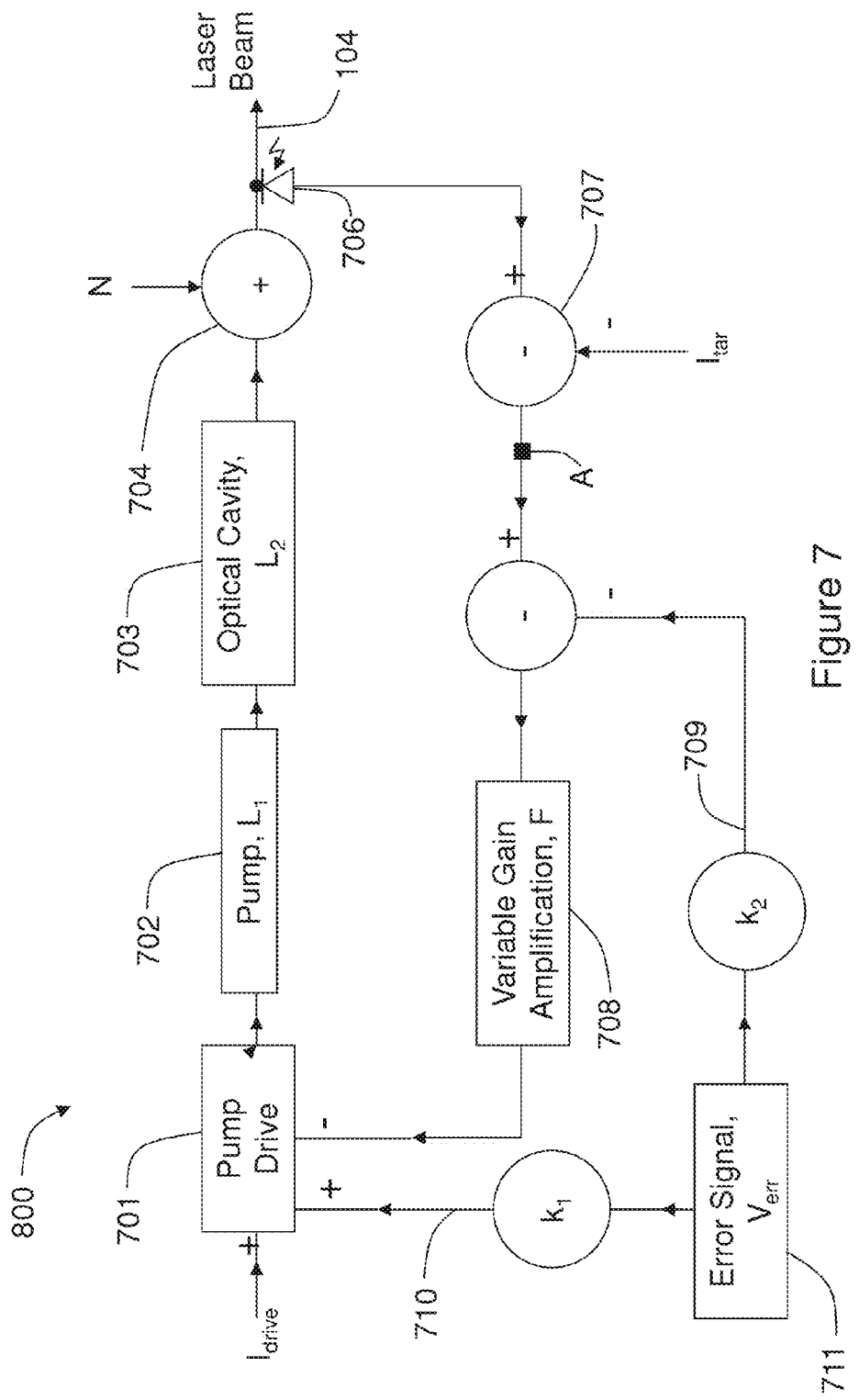
FIG. 7 is a schematic illustration of a feedback loop including an error signal according to an embodiment of the invention.

FIG. 7 depicts schematically a feedback loop 800 including an error signal $V_{err}$ according to an embodiment of the invention. Feedback loop 800 is identical to feedback loop 700 except that an error signal $V_{err}$ is added before and after the variable gain amplification stage 708 with gain factors $k_2$ and $k_1$ via feedback paths 709 and 710 respectively. An error signal $V_{err}$ is added to the feedback loop 700 from an input 711. The input 711 is configured to receive an error signal $V_{err}$ and add the error signal $V_{err}$ to the feedback loop 700 before and after the variable gain amplification stage 708, with gain factors $k_2$ and $k_1$ respectively. The gain factors $k_2$ and $k_1$ may be set such that the modulation of the power of the laser beam 104 caused by the error signal $V_{err}$ remains substantially constant for all values of the gain F of the variable gain amplification stage 708.

The signal at point A of feedback loop 800 can be calculated according to equation 5, $$A=((I_{drive}-AF+V_{err}k_2F+V_{err}k_1)L_1L_2)+N-I_{tar} \tag{5}$$

Equation 5 can be rearranged to show that the signal at point A is equal to, $$A = \frac{I_{drive}L_1L_2 + N - I_{tar}}{1 + FL_1L_2} + \frac{V_{err}(k_2F + k_1)L_1L_2}{1 + FL_1L_2} \tag{6}$$

The first term of the right hand side of equation 6 is equal to the signal at point A without adding an error signal $V_{err}$, given by equation 2. The difference $\Delta A$ between the signal at point A with and without adding an error signal is therefore given by the second term on the right hand side of equation 6, $$\Delta A = \frac{V_{err}(k_2F + k_1)L_1L_2}{1 + FL_1L_2} \tag{7}$$

If the gain F of the variable gain amplification stage 708 is set to 0 then $\Delta A$ is given by equation 8, $$\Delta A=V_{err}k_1L_1L_2 \tag{8}$$

If the gain F of the variable gain amplification stage 708 is sufficiently large such that F>>1, $$F \gg \frac{1}{L_1L_2} \text{ and } F \gg \frac{k_1}{k_2}$$

then $\Delta A$ is given by equation 9, $$\Delta A = V_{err} k_2 \quad (9)$$

In order for ΔA to be equal in both equations 8 and 9 (for F=0 and F is large, respectively) then the value of $k_2$ may be set according to equation 10, $$k_2 = k_1 L_1 L_2 \quad (10)$$

If the value of $k_2$, given by equation 10 is substituted into equation 7, the value of ΔA is given by equation 11, $$\Delta A = \frac{V_{err}(k_1 L_1 L_2 + k_1) L_1 L_2}{1 + F L_1 L_2} \quad (11)$$

Equation 11, may be simplified to give equation 12, $$\Delta A = V_{err} k_1 L_1 L_2 \quad (12)$$

Equation 12 is the same as equation 8 and thus if the loop variables are set such that $k_2 = k_1 L_1 L_2$ then the value of ΔA is not dependent on the gain F of the variable gain amplification stage 708. The transfer functions $L_1$ and $L_2$ are complex functions containing both magnitude and phase information. In order to satisfy the relation $k_2 = k_1 L_1 L_2$ the ratio of $k_2$ to $k_1$ will need to have the same phase and the same magnitude as $L_1 L_2$. In practice the relation $k_2 = k_1 L_1 L_2$ may not always be perfectly satisfied but satisfying only the magnitudes (real components) of the relation may produce a good enough approximation. In order to also satisfy the phases (complex components) of the relation $k_2 = k_1 L_1 L_2$ a phase lead compensator circuit may be added to the feedback path 709. A phase lead compensator circuit added to the feedback path 709 may advance the phase of signals at frequencies at which $L_1 L_2$ is small and/or at frequencies at which the feedback loop 700 substantially delays the phase of signals.

The feedback loop 800 has associated with it a laser power curve which determines the transfer function from the current $I_{drive}$ to the laser beam 104. The gradient of the power curve is equal to $L_1 L_2$. If the gradient of the power curve is substantially constant over the operating power range of the laser then the ratio of $k_1$ to $k_2$ may be fixed such that equation 10 is satisfied. If the gradient of the power curve varies significantly over the operating power range of the laser then the ratio of $k_1$ to $k_2$ may be adjusted, for example by a laser controller, in order to satisfy equation 10. A laser controller may determine the laser power curve empirically by monitoring the change in power of the laser beam 104 as a function of changes in the current $I_{drive}$. Alternatively the laser controller may read a predetermined laser power curve from a look-up table which is stored in a memory.

Inputting an error signal $V_{err}$ into the feedback loop causes the feedback loop to adjust the power supplied to the pump 101 (see FIG. 1) in the same way that the feedback loop adjusts the power supplied to the pump 101 in response to deviations of the detection current $I_{det}$ from the target current $I_{tar}$. The error signal $V_{err}$ may therefore be set such that the feedback loop acts to apply a desired adjustment of the power supplied to the pump 101 in order to achieve a desired adjustment in the power of the laser beam 104. If the error signal $V_{err}$ causes the feedback signal to approach the limits or fall outside of its window of operation then a laser controller may adjust $I_{tar}$ or $I_{drive}$ in order to bring the feedback signal to within the limits of its window of operation. In an embodiment, the laser controller adjusts either $I_{tar}$ or $I_{drive}$ such that the time averaged value of $I_{det} - I_{tar}$ is equal to zero. In an alternative embodiment, the laser controller adjusts either $I_{tar}$ or $I_{drive}$ such that the time averaged value of $I_{det} - I_{tar}$ is equal to a predetermined constant.

The error signal $V_{err}$ may be varied by small amounts at frequencies within a large frequency bandwidth in order to cause small modulations in the power supplied to the pump 101, where the magnitude of the modulations in the power supplied to the pump are typically a small fraction of the total power supplied to the pump 101. The error signal $V_{err}$ may also be varied by larger amounts over longer time scales in order to vary the power supplied to the pump 101 across the entire operating power range of the laser.

This may be particularly advantageous if the laser beam 104 is used to pump another laser such as titanium sapphire laser. The laser beam 104 may be used to pump a titanium sapphire laser as part of a Carrier Envelope Phase stabilised system which may require relatively large changes in the power of the laser beam 104 at low frequencies (thus over long time periods) but only small changes in the power of the laser beam 104 at high frequencies. The time scales on which small modulations are applied to the laser beam 104 may typically be <0.01% or <1% of the time scales on which large modulations are applied to the laser beam 104.

The gain F of the variable gain amplification stage of feedback loops 700 and 800 may be adjusted in order to reduce the noise in the laser beam 104 over specific frequency bandwidths. The total loop gain of feedback loops 700 and 800 is equal to $FL_1 L_2$. As the loop gain increases from 0, the noise in the laser beam 104 is a function of $$\frac{1}{1 + F L_1 L_2}.$$

Increasing the gain F of the variable gain amplification stage therefore acts to reduce the noise in the laser beam 104. However, the feedback loops 700 and 800 have associated with them a time lag, where the time lag is the time taken for the feedback loop to respond to the detection current $I_{det}$ and adjust the power supplied to the pump 101. The time lag introduces a phase shift between a noise component, at a particular frequency, of the laser beam 104 and the resulting adjustment of the power supplied to the pump 101. The phase shift increases with frequency. At higher frequencies the phase shift may approach 180 degrees. At a phase shift which approaches 180 degrees the feedback loop acts to increase rather than reduce the noise in the laser beam 104.

Figure 8:
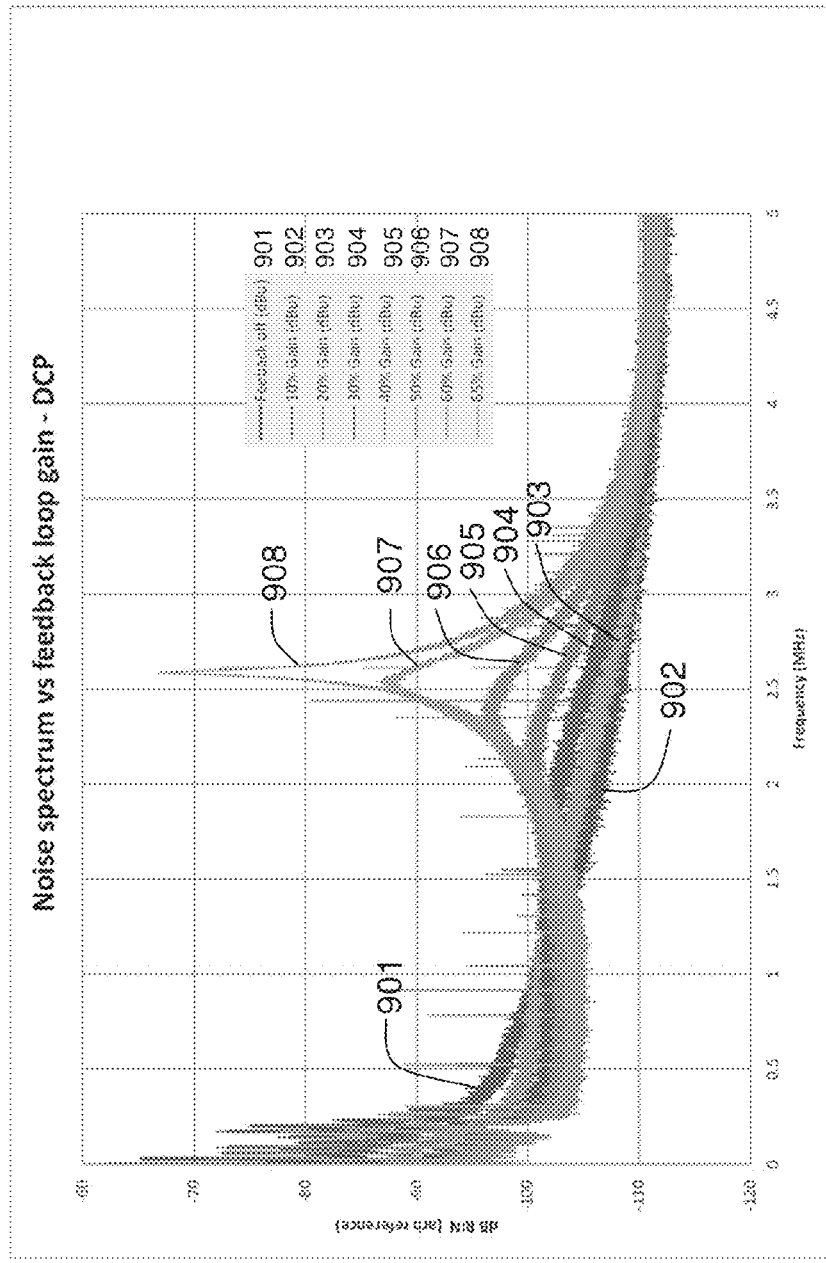
FIG. 8 is a graph showing the relative intensity noise of a laser beam as a function of frequency for different values of the gain of a variable gain amplification stage.

FIG. 8 is a graph of an example of the relative intensity noise of the laser beam 104 as a function of frequency for different values of the gain F of the variable gain amplification stage 708. Line 901 displays the relative intensity noise of the laser beam 104 with the gain F of the variable gain amplification stage 708 equal to zero. Lines 902, 903, 904, 905, 906, 907 and 908 display respectively the relative intensity noise of laser beam 104 with the gain F of the variable gain amplification stage 708 equal to approximately 10%, 20%, 30%, 40%, 50%, 60% and 65% of the maximum gain of the variable gain amplification stage 708. Lines 901-908 show that as the gain F increases the relative intensity noise at low frequencies decreases. However, lines 901-908 also display noise peaks at high frequencies (e.g. around 2.5 MHz) which correspond to frequencies at which the phase shifts approach 180 degrees. The frequency at which a noise peak occurs may depend on the gain F of the variable gain amplification stage 708. As the gain F of the variable gain amplification stage 708 increases, the frequency at which a noise peak occurs may subtend to 180 degrees. The frequency at which a noise peak occurs may lie between 90 and 180 degrees. As the gain F of the variable gain amplification stage 708 increases, the magnitude of the noise peak increases.

The gain F of the variable gain amplification stage 708 may be set such that the total loop gain is equal to an ideal loop gain at which the relative intensity noise of the laser beam 104 is reduced (e.g. minimised) over a desired frequency bandwidth. The total loop gain is a function of $L_1$ and $L_2$ as well as F. If the gradient of the laser power curve, $L_1L_2$ is not substantially constant over the operating power range of the laser then the gain F of the variable gain amplification stage 708 may be adjusted in order to keep the total loop gain substantially equal to the ideal loop gain. The gain F of the variable gain amplification stage 708 may be controlled by a laser controller which acts to keep the total loop gain equal to the ideal loop gain.

The desired frequency bandwidth over which the relative intensity noise of the laser beam 104 is reduced may depend on the application of the laser beam 104. The ideal loop gain may therefore depend on the application of the laser beam 104. For some applications of the laser beam 104 there may be a frequency limit above which an application target does not respond significantly and hence it may not be important to reduce the noise in the laser beam 104 at frequencies above the frequency limit. The ideal loop gain is therefore set to reduce the total noise in the laser beam 104 at frequencies below the frequency limit. If the frequency at which a noise peak occurs is larger than the frequency limit, it may be beneficial to increase the loop gain in order to further reduce the noise in the laser beam 104 at low frequencies. Increasing the loop gain may however, increase the noise at frequencies in the region of the frequency at which a noise peak occurs. The frequency at which a noise peak occurs may for example be >1 MHz, >2 MHz, >3 MHz or >4 MHz.

In general it may be desirable to reduce noise in a laser beam at frequencies up to at least 10 kHz. It may therefore be desirable for the feedback signal to have a bandwidth which is at least 10 kHz such that it acts to reduce noise components in the laser beam up to at least 10 kHz. It may therefore be desirable to set the loop gain such that the noise peak occurs at a frequency which is greater than 10 kHz.

For some applications it may be desirable to reduce the noise in a laser beam at frequencies which are greater than 10 kHz. For such applications it is advantageous for the feedback signal to have a bandwidth which extends to a frequency which is greater than a maximum frequency below which it is desirable to reduce noise components. In an embodiment the feedback signal may have a bandwidth of 100 kHz or more (thereby providing a noise reduction in the laser beam at frequencies up to 100 kHz or more). It Where this is the case, the loop gain may be set such that the noise peak occurs at a frequency which is greater than 100 kHz.

Figure 9:
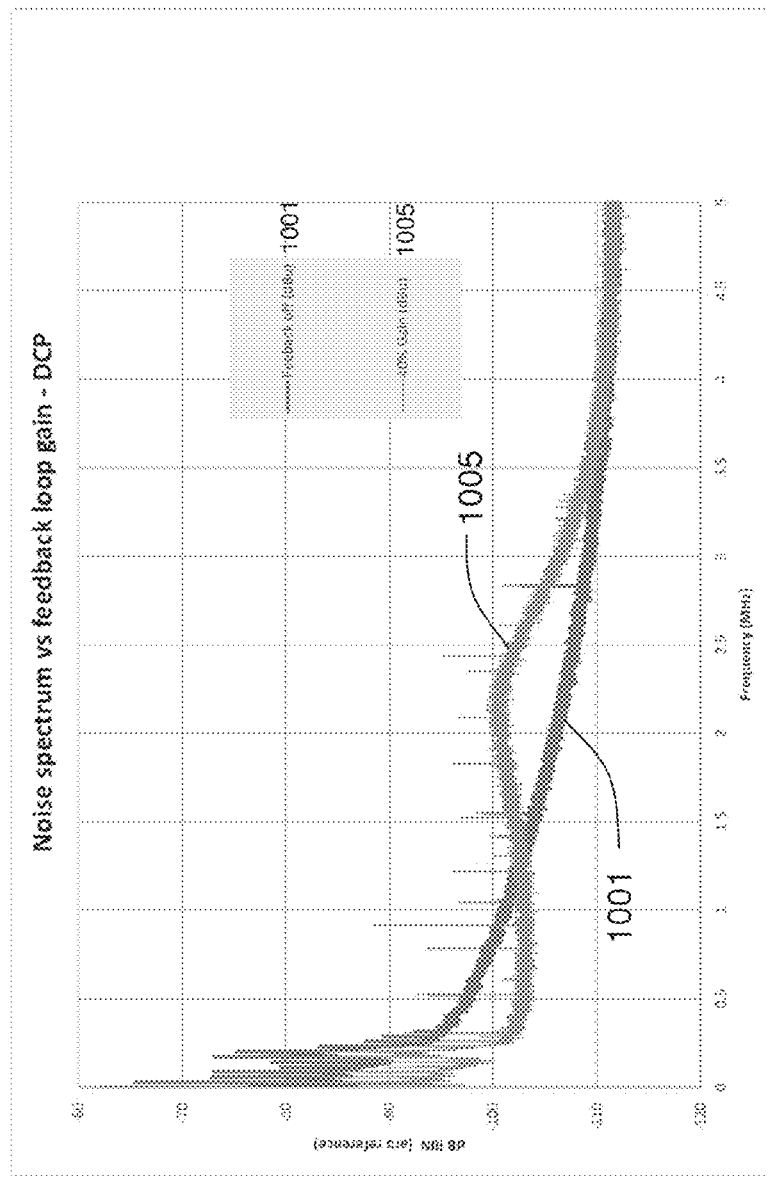
FIG. 9 is a graph showing the relative intensity noise of a laser beam as a function of frequency for two values of the gain of a variable gain amplification stage.

FIG. 9 is a graph of the relative intensity noise of the laser beam 104 as a function of frequency for two values of the gain F of the variable gain amplification stage 708. Line 1001 displays the relative intensity noise of the laser beam 104 with the gain F of the variable gain amplification stage 708 equal to zero. Line 1005 displays the relative intensity noise of laser beam 104 with the gain F of the variable gain amplification stage 708 equal to 40% of the maximum gain of the variable gain amplification stage 708. At frequencies <0.5 MHz, the relative intensity noise with the gain F equal to 40% of the maximum gain (line 1005) is approximately 10 dB less than the relative intensity noise with the gain F equal to zero (line 1001). At a frequency of 0.5 MHz line 1005 is approximately 5 dB lower than line 1001. Line 1005 displays a noise peak at a frequency of approximately 2.2 MHz, at which line 1005 is approximately 6 dB higher than line 1001. The relative intensity noise at a frequency of approximately 2.2 MHz is however at a reduced level compared to the relative intensity noise at higher frequencies. The noise peak of line 1005 at a frequency of approximately 2.2 MHz does not therefore substantially add to the integrated percentage root mean square noise. The integrated percentage root mean square noise of line 1001 is approximately 0.04% and the integrated percentage root mean square noise of line 1005 is approximately 0.01%. A gain F of the variable gain amplification stage 708 equal to 40% of the maximum gain therefore substantially reduces the integrated percentage root mean square noise of laser beam 104, when compared to a gain F of the variable gain amplification stage 708 equal to zero.

The frequency at which a noise peak occurs may be increased by adding one or more phase-advance or phase lead compensator circuits to a feedback loop. Increasing the frequency at which a noise peak occurs may allow for the gain F of the variable gain amplification stage to be further increased and the noise in the laser beam 104 to be further reduced.

A phase lead compensation circuit may include one or more resistors and/or one or more capacitors. The phase lead compensation of a phase lead compensator circuit may be adjusted by adjusting the resistance of the one or more resistors and/or adjusting the capacitance of the one or more capacitors. A laser controller may adjust the resistance of the one or more resistors and/or the capacitance of the one or more capacitors in order to adjust the phase lead compensation of a phase lead compensation circuit. A laser controller may additionally or alternatively control electronic switches connected to phase lead compensator circuits in order to choose between one or more phase lead compensator circuits to be added to a feedback loop. A laser controller may therefore adjust the phase lead compensation of a feedback loop by adjusting the phase lead compensation of one or more phase lead compensation circuits and/or by controlling electronic switches in order to choose between one or more phase lead compensator circuits to be added to a feedback loop. More than one phase lead compensator circuit may be switched in to the feedback loop. The phase lead compensation of a feedback loop may be adjusted in order to reduce the noise in the laser beam 104 over a desired frequency bandwidth which may depend on the particular application of laser beam 104.

Figure 10:
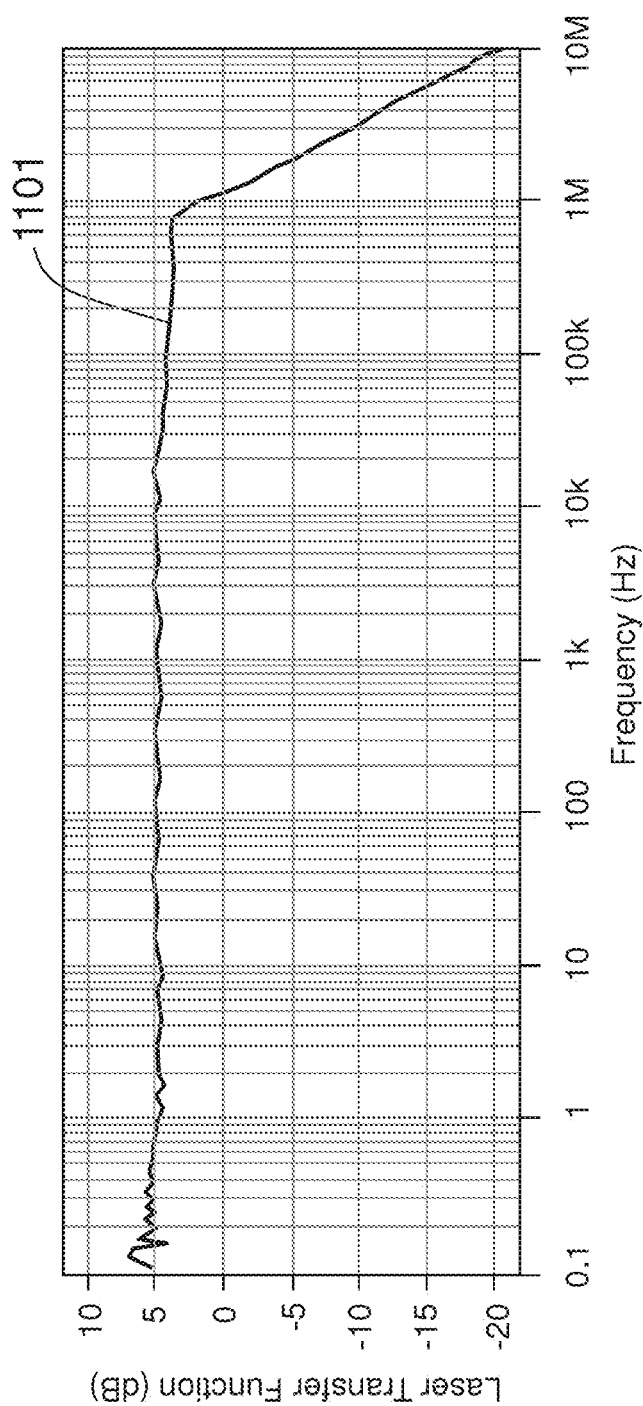
FIG. 10 is a graph showing a typical laser transfer function of a titanium sapphire laser as a function of frequency.

Adding one or more phase lead compensator circuits to a feedback loop may however increase the noise in the laser beam 104 at higher frequencies, such as a frequency of approximately 3 MHz and above. In some applications however, this may not cause a problem. If the laser beam 104 is used to pump another laser such as a titanium sapphire laser then an increase in the noise in the laser beam 104 at high frequencies may not cause an increase in the noise of the titanium sapphire laser. A laser transfer function which relates the pump power supplied to a titanium sapphire laser to the power of the titanium sapphire laser beam typically reduces at high frequencies. The reduction in the laser transfer function of the titanium sapphire laser and the increase in the noise in the laser beam 104 at high frequencies may therefore act to partially cancel each other out. FIG. 10 is a graph of the laser transfer function of a typical titanium sapphire laser as a function of frequency. Line 1101 displays a measured laser transfer function of the titanium sapphire laser. The laser transfer function of the titanium sapphire laser decreases at a rate of approximately 6 dB per octave at frequencies greater than approximately 800 kHz. A small increase in the noise at a frequency of 3 MHz of the laser beam 104 used to pump the titanium sapphire laser will therefore have a reduced impact on the titanium sapphire laser beam.

The laser beam 104 may be used to pump another laser such as a titanium sapphire laser. Where this is the case, the measured noise of the laser beam 104 may be passed through a filter which mimics the transfer function of the titanium sapphire laser, in order to predict the resulting noise in the titanium sapphire laser beam. The gain F of the variable gain amplification stage 708 may then be adjusted in order to reduce the noise in the titanium sapphire laser beam. This approach may also be used for other types of lasers pumped by the laser beam 104. Adjustment of the gain F of the variable gain amplification stage 708 in order to reduce the noise of a laser being pumped by the laser beam 104 may be controlled by a laser controller.

In an alternative approach, a user may monitor the noise in the laser beam 104 and manually adjust the gain F of the variable gain amplification stage 708 in order to reduce the noise in the laser beam 104 over a frequency bandwidth suitable for the application of laser beam 104.

Figure 11:
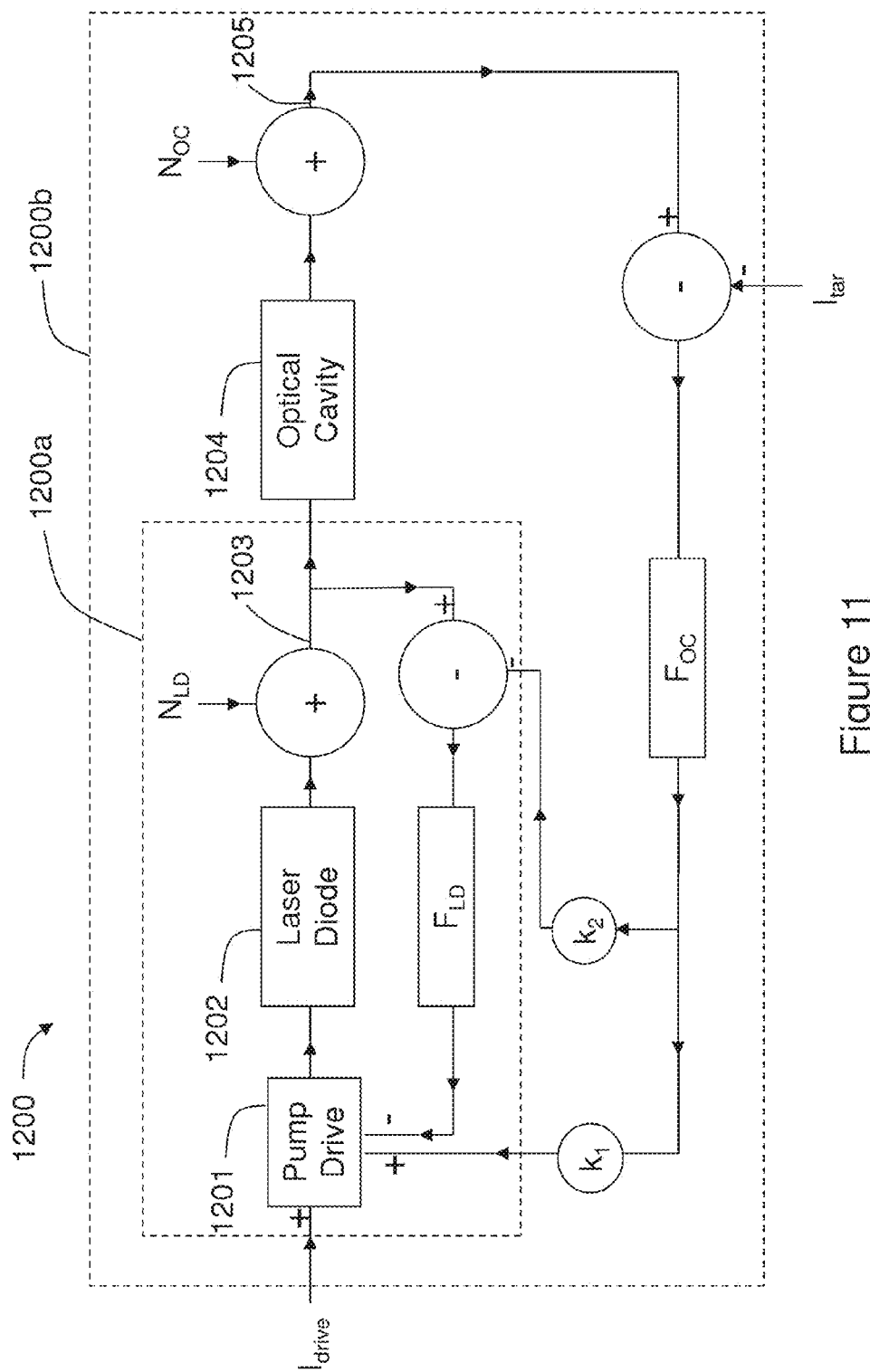
FIG. 11 is a schematic illustration of a feedback system comprising two feedback loops.

If the pump 101 comprises an optical pump such as one or more laser diodes, a separate feedback loop may be used to control the one or more laser diodes based on the output of those laser diodes. FIG. 11 depicts schematically a feedback system 1200 comprising two feedback loops 1200a and 1200b. A drive current $I_{drive}$ is input to a pump drive 1201 which drives a laser diode 1202. The laser diode 1202 outputs a laser diode beam 1203 having a noise component $N_{LD}$. Noise component $N_{LD}$ is shown in FIG. 11 as being added after the output of laser diode 1202 but noise may be introduced at any point. Feedback loop 1200a acts on a measurement of the laser diode beam 1203 to produce a feedback signal which is amplified by a gain $F_{LD}$ which is fed back to adjust the power supplied to laser diode 1202 in order to reduce the noise in the laser diode beam 1203. The feedback loop 1200a may also allow the power of the laser diode beam 1203 to be varied in a desired manner. The feedback loop 1200a may have a shorter delay time than a feedback loop including a pump and an optical cavity such as the feedback loop 1200b. The shorter delay time of the feedback loop 1200a allows for the noise in the laser diode beam 1203 to be reduced at higher frequencies, than a feedback loop having a longer delay time. The feedback loop 1200a may include any of the features described above in relation to other embodiments of the invention.

The laser diode beam 1203 pumps an optical cavity 1204 which produces a laser beam 1205 having a noise component $N_{OC}$. Noise $N_{OC}$ is shown in FIG. 11 as being added after the output of the optical cavity 1204 but noise may be introduced at any point. Feedback loop 1200b acts on a measurement of the laser beam 1205 to produce a feedback signal which is amplified by a gain $F_{OC}$ and fed back to adjust the power supplied by the pump drive 1201 to the laser diode 1202 in order to reduce the noise in the laser beam 1205. An error signal $V_{err}$ may be added to feedback loop 1200b in order to adjust of the power of the laser beam 1205.

Feedback loop 1200b controls feedback loop 1200a by adding a fraction of the signal from feedback loop 1200b to the feedback loop 1200a before and after the gain stage $F_{LD}$ with gain factors $k_2$ and $k_1$ respectively. Adding a fraction of the signal from the feedback loop 1200b into the feedback loop 1200a allows an error signal $V_{err}$ (added to the feedback loop 1200b) to adjust the power of the laser beam 1205 by similar amounts regardless of the gains $F_{LD}$ and $F_{OC}$ of the feedbacks loops 1200a and 1200b respectively.

The laser beam 1205 may be used to pump another laser such as a titanium sapphire laser. If the laser beam 1205 is used to pump another laser then a third feedback loop may be used to measure the output power of the other laser and feed back a signal to adjust the power supplied to the laser diode 1201 in order to reduce the noise component of the power of the other laser.

In this document the term "low frequency" may be interpreted as meaning frequencies below around 10 Hz. The term "high frequency" may be interpreted as meaning frequencies above around 10 kHz.

The term "DC" may be interpreted as meaning that there is little or no variation within the time frame of interest. The term "DC" may be interpreted as encompassing frequencies close to but not necessarily exactly 0 Hz. For example a signal described as DC may be considered as only including components having frequencies of less than 0.1 Hz, or even less than 1 mHz such that there is little or no variation within the time frame of interest.

The term "bandwidth" may be considered to mean the width or spread of a range of frequencies.

The term "high bandwidth" may be interpreted as meaning a bandwidth which extends from a DC frequency such as a frequency of 0 Hz, 0.01 Hz or 0.1 Hz to a high frequency such as a frequency which is equal to or greater than 10 kHz. For example, a high bandwidth may extend to a high frequency such as 10 kHz, 100 kHz, 1 MHz, 10 Mhz or 100 MHz.

The term "low bandwidth" may be interpreted as meaning a bandwidth which extends from a DC frequency such as a frequency of 0 Hz, 0.01 Hz or 0.1 Hz, to a low frequency such as a frequency 0.01 Hz, 0.1 Hz, 1 Hz or 10 Hz.

The term "high bandwidth" may be interpreted as meaning a bandwidth of more than 10, 100, 1000, 10,000, 100,000, 1,000,000, or even 10,000,000 times the bandwidth of the low bandwidth component.

A signal should only be considered to extend to frequencies at which the signal contains components which have a tangible effect when the signal is used in an application. For example, a low bandwidth signal may contain inconsequential high frequency components which in practice have little or no effect on applications of the signal (e.g. little or no effect on the output laser beam, or little or no effect on the application for which the output laser beam is used). Such a signal should still be considered to be a low bandwidth signal if the components of the signal which have a tangible effect all occur at frequencies which lie within a low bandwidth.

Specific embodiments of the invention have been described in which amplification has comprised transforming a current or voltage to a larger current or voltage. Reference in this document to amplification of a signal, may be interpreted as meaning any transformation or conditioning of a signal. Transformation or conditioning of a signal may include conversion of a signal carried as a voltage to a signal carried as a current, or vice versa. Such conversions for the purposes of this document may be considered as amplifications.

According to an embodiment, the power of a laser beam is detected to form a detection signal. A feedback signal is then formed by subtracting a target signal from the detection signal. The detection signal is amplified and a drive current which drives the laser is adjusted according to the amplified feedback signal. In this embodiment the amplification of the feedback signal may comprise multiple transformations or conditionings of the feedback signal. Typically, the signal which is used to adjust the drive current at the laser (which may be referred to as the amplified feedback signal) has an amplitude which is greater than the change in detection signal that caused it. Thus, the signal may be said to have been amplified.

Whilst specific embodiment of the invention have been described in relation to providing a laser with a drive current, which may be adjusted according to a high bandwidth feedback signal, it should be appreciated that in some embodiments a laser may instead be provided with a drive voltage. A drive voltage may be adjusted according to a high bandwidth feedback signal, thereby reducing noise in the laser beam. For example a laser pumped with a laser diode may be provided with a drive current and a laser pumped with a lamp may be provided with a drive voltage. The term "drive power" may be considered to encompass drive voltage and a drive current (drive power may for example be drive current or drive voltage). Changing either current or voltage will change the drive power, since power is calculated to be the multiple of current and voltage.

Although specific embodiments of the invention have been described in the context of a high bandwidth feedback signal and a low bandwidth target signal, the bandwidths of the feedback signal and the target signal need not be restricted to any particular bandwidth range. For example the target signal could have a high bandwidth.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the appended claims.

The invention claimed is:

1. A laser system comprising:
   a laser configured to generate a laser beam;
   a power supply arranged to provide a drive power to the laser;
   a photodetector arranged to detect the power of the laser beam and provide a detection signal from the power of the laser beam, wherein the detection signal corresponds to the power of the laser beam; and
   a feedback loop arranged to:
      form a feedback signal by subtracting a target signal from the detection signal, wherein the feedback signal has a high bandwidth which extends continuously from a DC frequency to a high frequency;
      amplify the feedback signal; and
      adjust the drive power according to the amplified feedback signal, thereby reducing noise in the laser beam.

2. The laser system of claim 1, wherein the target signal has a lower bandwidth than the feedback signal.

3. The laser system of claim 1, wherein the feedback signal has a bandwidth greater than 10 times the bandwidth of the target signal.

4. The laser system of claim 3, wherein the feedback signal has a bandwidth greater than 1000 times the bandwidth of the target signal.

5. The laser system of claim 1, wherein the target signal has a low bandwidth.

6. The laser system of claim 1, wherein the feedback signal has a bandwidth which is greater than or equal to 10 kHz.

7. The laser system of claim 6, wherein the feedback signal has a bandwidth which is greater than or equal to 100 kHz.

8. The laser system of claim 1, further comprising a low-pass filter configured to low-pass filter the target signal before the subtraction of the target signal from the detection signal.

9. The laser system of claim 1, wherein the target signal has an amplitude of greater than two times the amplitude of the feedback signal.

10. The laser system of claim 1, wherein the drive power comprises a first power having a low bandwidth from which a second power having a high bandwidth is subtracted.

11. The laser system of claim 1, wherein the drive power comprises a first power having a low bandwidth summed with a second power having a high bandwidth.

12. The laser system of claim 10, wherein adjusting the drive power according to the amplified feedback signal comprises adjusting the second power according to the amplified feedback signal.

13. The laser system of any of claim 10, further comprising a controller arranged to control the first power and/or the target signal such that an average over time of the feedback signal is substantially equal to zero or a predetermined constant.

14. The laser system of claim 1, wherein the feedback loop further comprises a variable gain amplifier.

15. The laser system of claim 13, wherein the feedback loop further comprises a variable gain amplifier and wherein the controller is further arranged to control the gain of the variable gain amplifier such that it reduces noise in the laser beam over a predetermined bandwidth.

16. The laser system of any of claim 1, wherein the feedback loop further comprises one or more phase lead compensator circuits, wherein the one or more phase lead compensator circuits are configured to advance the phase of the amplified feedback signal.

17. The laser system of claim 15, wherein the feedback loop further comprises one or more phase lead compensator circuits, wherein the one or more phase lead compensator circuits are configured to advance the phase of the amplified feedback signal, and wherein the controller is further arranged to adjust the phase lead compensation of the one or more phase lead compensator circuits such that it reduces noise in the laser beam over a predetermined bandwidth.

18. The laser system of claim 1, further comprising an input configured to receive an error signal and add the error signal to the feedback signal.

19. The laser system of claim 18, wherein the input is further configured to:
   add a first portion of the error signal to the feedback signal before amplification; and
   add a second portion of the error signal to the feedback signal after amplification.

20. The laser system of claim 1, wherein the laser comprises a pump configured to transfer power to a gain medium, the gain medium being configured to generate a laser beam.

21. The laser system of claim 20, wherein the pump comprises a laser diode system, comprising:
   a laser diode configured to generate a laser diode beam;
   a second photodetector arranged to detect the power of the laser diode beam and form a laser diode detection signal from the power of the laser diode beam; and
   a laser diode feedback loop arranged to form a high bandwidth laser diode feedback signal by subtracting a low bandwidth laser diode target signal from the laser diode detection signal, amplify the high bandwidth laser diode feedback signal and adjust, according to the amplified high bandwidth laser diode feedback signal, the drive power, thereby reducing fluctuations of the power of the laser diode beam.

22. The laser system of claim 21, wherein a portion of the feedback signal is added to the high bandwidth laser diode feedback signal.

23. The laser system of claim 22, wherein a first portion of the feedback signal is added to the high bandwidth laser diode feedback signal before amplification and a second portion of the feedback signal is added to the high bandwidth laser diode feedback signal after amplification.

24. The laser system of claim 1, wherein the power supply is positioned within a control box, and wherein the laser, the photodetector and the feedback loop are positioned within a laser head.

25. A method of reducing noise in a laser beam generated by a laser, the method comprising:
   detecting the power of the laser beam to form a detection signal, wherein the detection signal corresponds to the power of the laser beam;
   forming a feedback signal by subtracting a target signal from the detection signal, wherein the feedback signal has a high bandwidth which extends continuously from a DC frequency to a high frequency;
   amplifying the feedback signal; and
   adjusting, according to the amplified feedback signal, a drive power which drives the laser, thereby reducing noise in the laser beam.

26. The method of claim 25, wherein the target signal has a lower bandwidth than the feedback signal.

27. The method of claim 25, wherein the feedback signal has a bandwidth greater than 10 times the bandwidth of the target signal.

28. The method of claim 27, wherein the feedback signal has a bandwidth greater than 1000 times the bandwidth of the target signal.

29. The method of claim 25, wherein the target signal has a low bandwidth.

30. The method of claim 25, wherein the feedback signal has a bandwidth which is greater than or equal to 10 kHz.

31. The method of claim 30, wherein the feedback signal has a bandwidth which is greater than or equal to 100 kHz.

32. The method of claim 25, wherein forming the feedback signal by subtracting the target signal from the detection signal, further comprises low-pass filtering the target signal before the subtraction of the target signal from the detection signal.

33. The method of claim 25, wherein the target signal has an amplitude of greater than two times the amplitude of the feedback signal.

34. The method of claim 25, wherein the drive power comprises a first power having a low bandwidth from which a second power having a high bandwidth is subtracted.

35. The method of claim 25, wherein the drive power comprises a first power having a low bandwidth summed with a second power having a high bandwidth.

36. The method of claim 34 or 35, wherein adjusting the drive power according to the amplified feedback signal comprises adjusting the second power, according to the amplified feedback signal.

37. The method of claim 34, further comprising controlling the first power and/or the target signal such that an average over time of the feedback signal is substantially equal to zero or a predetermined constant.

38. The method of claim 25, further comprising adding an error signal to the feedback signal.

39. The method of claim 38, wherein a first portion of the error signal is added to the feedback signal before amplification and a second portion of the error signal is added to the feedback signal after amplification.

40. The method of claim 31, wherein the feedback signal has a bandwidth which is greater than or equal to 1 MHz.

41. The method of claim 40, wherein the feedback signal has a bandwidth which is greater than or equal to 10 MHz.

42. The laser system of claim 7, wherein the feedback signal has a bandwidth which is greater than or equal to 1 MHz.

43. The laser system of claim 42, wherein the feedback signal has a bandwidth which is greater than or equal to 10 MHz.

* * * * *